(12) United States Patent
Dallas et al.

(10) Patent No.: US 8,816,999 B2
(45) Date of Patent: *Aug. 26, 2014

(54) ADJUSTMENT OF LIQUID CRYSTAL DISPLAY VOLTAGE

(75) Inventors: James M. Dallas, Superior, CO (US); David B. Hollenbeck, Frederick, CO (US); Per Harold Larsen, Boulder, CO (US); Rainer M. Malzbender, Niwot, CO (US); Earle R. Vickery, III, Henderson, NV (US); Michael Wayne Yee, Broomfield, CO (US)

(73) Assignee: Citizen Finetech Miyota Co., Ltd., Nagano (JP)

( * ) Notice: Subject to any disclaimer, the term of this patent is extended or adjusted under 35 U.S.C. 154(b) by 13 days.

This patent is subject to a terminal disclaimer.

(21) Appl. No.: 13/117,966

(22) Filed: May 27, 2011

(65) Prior Publication Data

US 2011/0227887 A1 Sep. 22, 2011

Related U.S. Application Data

(63) Continuation of application No. 13/051,899, filed on Mar. 18, 2011, now abandoned, which is a continuation of application No. 12/815,108, filed on Jun. 14, 2010, now Pat. No. 7,932,875, which is a continuation of application No. 11/873,309, filed on Oct. 16, 2007, now Pat. No. 7,755,570, which is a continuation of application No. 10/831,545, filed on Apr. 23, 2004, now Pat. No. 7,283,105.

(60) Provisional application No. 60/465,364, filed on Apr. 24, 2003.

(51) Int. Cl.
G09G 3/00 (2006.01)

(52) U.S. Cl.
USPC ............................................. 345/205; 345/32

(58) Field of Classification Search
USPC ............ 345/32, 55, 87–89, 204, 690, 97–103
See application file for complete search history.

(56) References Cited

U.S. PATENT DOCUMENTS 4,087,792 A 5/1978 Asars
4,194,215 A 3/1980 Shionoya
(Continued)

FOREIGN PATENT DOCUMENTS

EP 1300826 A2 4/2003
JP 07-092935 4/1995

OTHER PUBLICATIONS

M. Senda, Y. Tsutsui, R. Yokoyama, K. Yoneda, S. Matsumoto, A. Sasaki, "Ultra-Low-Power Polysilicon AMLCD with Full Integration," SID 02 Digest, 2002, pp. 790-793.

(Continued)

Primary Examiner — Ricardo L Osorio

(57) ABSTRACT

Drive voltages of a liquid crystal display are adjusted based on one or more environmental conditions. The pixel drive voltages may be adjusted based on temperature. A pixel voltage may be varied such that it is a higher voltage at relatively lower temperatures and a lower voltage at relatively higher temperatures. The window voltage may be varied based on temperature. The window voltage may be stepped through different values within a display phase. The window voltage may be varied during a blanking period of the display phase such that the pixel sees a relatively larger voltage to obtain a desired initial state more quickly. Then, during a light modulating time period, the window voltage may be stepped such that there is a lower voltage field for holding the state of the pixel.

11 Claims, 22 Drawing Sheets

(56) References Cited

U.S. PATENT DOCUMENTS

| | | | |
|---|---|---|---|
| 4,427,978 A | 1/1984 | Williams | |
| 4,649,432 A | 3/1987 | Watanabe et al. | |
| 4,700,367 A | 10/1987 | Kawazoe et al. | |
| 4,743,096 A | 5/1988 | Wakai et al. | |
| 5,162,786 A | 11/1992 | Fukuda | |
| 5,191,333 A | 3/1993 | Nakano | |
| 5,225,823 A | 7/1993 | Kanaly | |
| 5,412,396 A | 5/1995 | Nelson | |
| 5,748,164 A | 5/1998 | Handschy et al. | |
| 5,798,746 A | 8/1998 | Koyama | |
| 5,808,800 A | 9/1998 | Handschy et al. | |
| 5,926,162 A | 7/1999 | Wood et al. | |
| 5,977,940 A | 11/1999 | Akiyama et al. | |
| 6,100,945 A * | 8/2000 | Crandall et al. | 349/25 |
| 6,157,396 A | 12/2000 | Margulis et al. | |
| 6,175,351 B1 | 1/2001 | Matsuura et al. | |
| 6,246,386 B1 | 6/2001 | Perner | |
| 6,249,269 B1 | 6/2001 | Blalock et al. | |
| 6,271,818 B1 | 8/2001 | Yamazaki et al. | |
| 6,329,974 B1 | 12/2001 | Walker et al. | |
| 6,340,994 B1 | 1/2002 | Margulis et al. | |
| 6,373,497 B1 | 4/2002 | McKnight et al. | |
| 6,441,829 B1 | 8/2002 | Blalock et al. | |
| 6,507,330 B1 | 1/2003 | Handschy et al. | |
| 6,525,709 B1 | 2/2003 | O'Callaghan | |
| 6,628,355 B1 * | 9/2003 | Takahara | 349/106 |
| 6,633,301 B1 | 10/2003 | Dallas et al. | |
| 6,727,872 B2 | 4/2004 | Pfeiffer et al. | |
| 6,731,257 B2 | 5/2004 | Pfeiffer et al. | |
| 6,801,213 B2 | 10/2004 | Bergstrom et al. | |
| 6,965,367 B2 * | 11/2005 | Tanaka et al. | 345/102 |
| 7,088,329 B2 | 8/2006 | Hudson | |
| 7,224,335 B2 | 5/2007 | Gibbon et al. | |
| 7,283,105 B2 | 10/2007 | Dallas et al. | |
| 7,443,374 B2 | 10/2008 | Hudson | |
| 7,468,717 B2 | 12/2008 | Hudson | |
| 8,174,545 B2 | 5/2012 | Morgan | |
| 2002/0033904 A1 * | 3/2002 | Yamamoto et al. | 348/760 |
| 2002/0050518 A1 | 5/2002 | Roustaei | |
| 2002/0057236 A1 | 5/2002 | Jacobsen et al. | |
| 2002/0149576 A1 * | 10/2002 | Tanaka et al. | 345/204 |
| 2003/0227597 A1 * | 12/2003 | Silverstein et al. | 353/20 |
| 2007/0018919 A1 | 1/2007 | Zarracky | |

OTHER PUBLICATIONS

Hiroyuki Kimura, Takashi Maeda. Takanori Tsunashima, Tetsuo Morita, Hiroyoshi Murata, Shinichi Hirota, Hajime Sato, "A 2.15 inch QCIF Reflective Color TFT-LCD with Digital Memory on Glass (DMOG)," SID 01 Digest, 2001, pp. 268-271.

Yoshiharu Nakajima, Yasuyuki Teranishi, Yoshitoshi Kida, Yasuhito Maki, "Ultra-low-power LTPS TFT-LCD technology using a multi-bix pixel memory circuit," Journal of the SID, 2006. pp. 1071-1075.

Khella, "A Low-Power High Performance Current-Mode Multiport SRAM," IEEE Transaction on VLSI Systems, vol. 9, No. 5, pp. 590-598 (Oct. 2001).

Blalock and Jaeger, "A High-Speed Clamped Bit-Line Current-Mode Sense Amplifier," IEEE Journal of Solid-State Circuits, vol. 26, No. 4 (Apr. 1991).

* cited by examiner

HALF-ADDER

MASTER-SLAVE FLIP-FLOP

ADJUSTMENT OF LIQUID CRYSTAL DISPLAY VOLTAGE

CROSS-REFERENCE TO RELATED APPLICATIONS

This application is a continuation of U.S. patent application Ser. No. 13/051,899, filed Mar. 18, 2011, entitled "Adjustment of Display Illumination Timing," which is a continuation of U.S. patent application Ser. No. 12/815,108, filed Jun. 4, 2010, entitled "Microdisplay and Interface on a Single Chip," which is a continuation of U.S. patent application Ser. No. 11/873,309, filed Oct. 16, 2007, entitled "Microdisplay and Interface on a Single Chip," now issued as U.S. Pat. No. 7,755,570, which is a continuation of U.S. patent application Ser. No. 10/831,545, filed Apr. 23, 2004, entitled "Microdisplay and Interface on Single Chip," now issued as U.S. Pat. No. 7,283,105, which claims priority from U.S. Provisional Patent Application No. 60/465,364, filed Apr. 24, 2003, entitled "Microdisplay and Interface on a Single Chip," the contents of each of which are incorporated herein by reference.

BACKGROUND OF THE INVENTION

In the past several years, microdisplays have begun to displace cathode ray tubes (CRT) in various consumer product applications and to be a desirable near-eye display in certain newer product applications. These applications may include video camcorders, digital still cameras, and the emerging area of head-mounted displays. These microdisplays include miniature display panels made from a silicon integrated circuit "backplane" that can be viewed by a user via a lens system or any optical magnifier. Many microdisplays produce full color images, monochrome images, or black and white images by acting as a spatial light modulator on light provided by a separate light source. Spatial light modulator microdisplays may employ liquid crystal materials, such as ferroelectric or nematic liquid crystal materials, or may utilize other technologies such as miniature mechanical mirrors or other suitable light modulation technology. Alternatively, microdisplays may emit their own light by employing miniature light emitting arrays made from emitters such as electroluminescent phosphors or organic light-emitting diodes (OLED). In the case of liquid crystal spatial light modulators, they may be transmissive or reflective in nature. In the case of reflective spatial light modulators utilizing liquid crystals, one suitable arrangement is known as reflective LCOS (liquid crystal on silicon). Other arrangements, with liquid-crystal modulators that are frequently transmissive, include active-matrix backplanes made from thin-film transistors (TFT) of either polysilicon or amorphous silicon, or made from single-crystal silicon that has been "lifted off" of a bulk-silicon wafer, as exemplified by the microdisplay products of Kopin Corporation.

The different microdisplay technologies differ significantly in their drive voltage requirements. For example, the electroluminescent (EL) phosphor displays require pixel drive varying over approximately an 80 V range to switch a pixel from fully OFF to fully ON. EL microdisplays have achieved such drive voltages with backplanes fabricated with doubly-diffused MOS (DMOS) high-voltage transistors as pixel drivers. The nematic LCOS displays do not usually require voltages as high, typically needing voltage swings in the range of 9-18 V, or even as low as 5 V. In the case of LCOS using ferroelectric liquid crystals (FLCs), microdisplay products with pixels switching through only 3.3 V are currently in commercial production by the applicant. The 5 V and 3.3 V LCOS microdisplays have been made with backplanes fabricated in standard-logic CMOS processes having ground rules of 0.5 μm and 0.35 μm, respectively, where the standard CMOS logic provides adequate pixel drive voltage.

The different microdisplay technologies also differ in how they produce color. They may generate color in a field sequential fashion or via simultaneous generation of each of the three color fields using pixels with color triads. Field sequential color means displaying color images one color field at a time. For example, a red field may be displayed, followed by a green field, followed by a blue field. If these separate color fields are sequenced at a sufficiently high rate, the human eye/brain will integrate them together into a perceived full color image.

A further issue with microdisplays is generation of gray-scale images. It is advantageous to fabricate microdisplay backplanes as conventional silicon integrated circuits (ICs). Producing gray scale requires each display pixel to be capable of displaying multiple brightness levels. This can be accomplished by driving an analog-responding pixel emitter or modulator with analog circuitry. Silicon fabrication processes specialized for analog circuitry are known, but again typically cost more than baseline digital processes. Further, design of analog circuitry is more difficult and requires greater effort than design of similar digital circuitry. Analog circuitry is susceptible to a variety of noise and offset effects which can produce unwanted image artifacts if not carefully managed. Thus, it is desirable to provide gray-scale through purely digital circuitry.

A number of techniques capable of producing gray scale through digital drive that are suitable for microdisplays are known in the art. For example, fast-responding emitters and modulators such as those found in plasma displays, electroluminescent displays, light-emitting diodes, the Texas Instruments Digital Micromirror Device and other microelectromechanical (MEMS) devices, and ferroelectric liquid crystals (FLCs) can be driven with two-level drive in such a way that variations in the bright/dark duty cycle are used to produce apparent gray scale. In one class of such techniques, the image data is typically separated into "bit planes," ranging from the most-significant bit (MSB) plane down to the least-significant bit (LSB) plane, and the image data in the bit planes is written onto the display and held for an interval of duration proportional to the significance. Thus, in a very simple exemplary implementation, a pixel displaying an eight-bit monochrome gray scale would be written to eight times during a video frame, and might change state as many times. In fact, such gray scale techniques are known to produce severe visual artifacts, especially with moving pictures. One class of such artifacts is known as dynamic false contouring. Reduction of such artifacts requires complex variations of the simple example given above, with increased data processing, and more pixel state changes. Furthermore, production of a large number of gray shades, such as 256 gray shades usually required for high-quality video images, results in short LSB intervals during which the pixel emitter or modulator must be able to change states. Production of 60 Hz color images from three sequential color fields, each of which fields comprises an image with the abovementioned 256 levels may require switching in intervals as short as 1/(3×60× 255) of a second, which is about 22 μs. For some types of modulators, such as ferroelectric liquid crystal modulators, maintaining response times this fast can be difficult, especially in the lower-temperature portions of the ranges most displays are expected to operate over.

The bit-plane family of gray scale techniques can also be used with more slowly responding display materials such as nematic liquid crystals. In this case the pixel has an analog response to the RMS (root-mean-square) value of an underlying two-level electrical drive. In this case, the slow, averaging nature of the liquid crystal material prevents the occurrence of dynamic false contouring, but another class of artifacts occurs instead. Neighboring pixels driven to adjacent gray values may experience very different drive waveforms. For example, in an eight-bit gray-scale scheme, a pixel driven to gray value 128 (binary 10000000) might be driven high for approximately the first half of a video frame and low for the remainder, while another pixel driven to gray value 127 (binary 01111111) might be driven low for approximately the first half of a video frame and high for the remainder. If these two pixels are physically adjacent to each other, as would be the case if they were part of an image with a smoothly varying brightness, a strong lateral electrical field would be produced at the boundary between the two pixels. This lateral or fringing electrical field often produces in nematic liquid crystals a defect called a disclination. Such disclinations have a visual contrast to the adjacent liquid crystal material, often appearing much darker, and, once formed, are slow to disappear even when the electrical drive conditions that produced them are removed. Thus, brightness variations in the images produced on nematic microdisplays driven with bit-plane type digital drive become "decorated" with undesirable dark lines, which can persist momentarily even when the image content is changed.

Many of the above disadvantages of bit-plane type digital gray scale drive can be overcome by alternative two-state drive schemes that reduce the number of drive transitions per video frame. For example, pulse-width modulation (PWM) drive schemes have previously been used, for example as taught in U.S. Pat. Nos. 5,977,940, 6,249,269, 6,329,974, and 6,525,709. In these examples, each pixel has its own driver, which is typically "reset" to a chosen digital value at the beginning of the video field, and are then switched once (and only once) to the other digital value at a time proportionate to the desired gray value. However, the previous implementations referenced above, while utilizing digital pixel drive, have all relied on underlying analog pixel circuitry to perform a comparison between an analog image value, stored on a pixel capacitor, and a global analog ramp voltage, with each pixel having a analog voltage comparator in it. Analog storage of the image value was chosen to reduce achievable pixel size, since a single capacitor can store an 8-bit image value, replacing the function of eight digital memory registers. These analog implementations, while avoiding the image-artifact issues described above with respect to bit-plane type digital gray scale, all suffer from the practical difficulties previously described for analog circuitry.

It is against this background and with a desire to improve on the prior art that the present invention has been developed.

DETAILED DESCRIPTION OF THE PREFERRED EMBODIMENTS

Reference will now be made to the accompanying drawings, which assist in illustrating the various pertinent features of the present invention. Although the present invention will now be described primarily in conjunction with microdisplays based on spatial light modulators, it should be expressly understood that the present invention may be applicable to other applications where digital interfaces to image display systems, image compression, low power SRAM, and many other features of the present invention are required/desired. In this regard, the following description of a microdisplay system is presented for purposes of illustration and description only. Furthermore, the description is not intended to limit the invention to the form disclosed herein. Consequently, variations and modifications commensurate with the following teachings, and skill and knowledge of the relevant art, are within the scope of the present invention. The embodiments described herein are further intended to explain best modes known of practicing the invention and to enable others skilled in the art to utilize the invention in such, or other embodiments and with various modifications required by the particular application(s) or use(s) of the present invention.

As can be appreciated from the background of the invention, it is desirable to implement PWM gray scale in digital architecture. Before describing how this has been done by the inventors, we first have set out below why a straightforward implementation of a digital PWM technique is likely to suffer from a high degree of pixel complexity. The complexity of digital implementations of microdisplays depend on the total number of image bits needed per pixel, which in turn depends on a display's gamma characteristic. Gamma ($\gamma$) is the exponent of a power-law relationship between display brightness and input image value. The abovementioned "bit-plane" type digital gray scale techniques produce a linear relationship between image data value and display brightness, and thus have $\gamma=1$, as do most PWM schemes. On the other hand, typical CRT displays have $\gamma \geq 2$, which, it turns out, better matches the characteristics of human perception. Gamma values of about two result in brightness steps between numerically adjacent input data that have more nearly even perceptual spacing, while for $\gamma=1$, the perceived brightness steps are large at the low-brightness end of the scale and small at the high-brightness end of the gray scale. It is generally thought that the image-quality penalty for $\gamma=1$ is about two bits per color; that is, to display an image equal in quality to a standard 24-bit image on a CRT requires 30 bits on a $\gamma=1$ display. Thus, a $\gamma=1$ display operating directly from a standard 8-bit/color input signal produces a color palette most similar in perceptible quality to a CRT with a palette of $2^{18}=262,144$ colors, instead of the desired 16.7 million-color palette.

Figure 17:
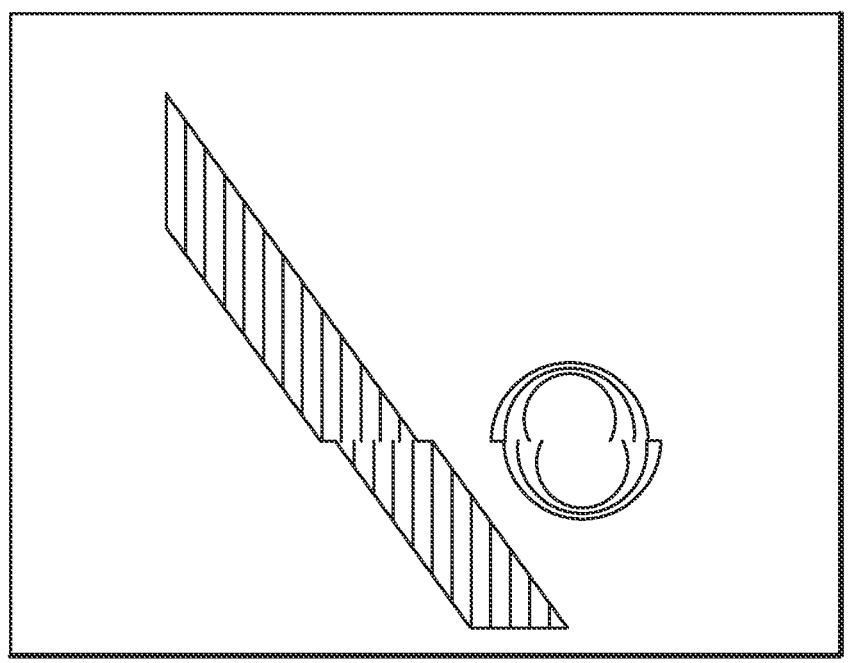
FIG. 17 is an illustration of a visual artifact known as tearing that is visible in some displays of moving images.

In the case of microdisplays generating field sequential color images, current products typically include a separate interface chip upstream of the microdisplay to convert the incoming standard video image data into an acceptable format for the microdisplay. For example, a standard digital video image signal may provide red data for a first pixel (picture element), green data for that same pixel, and then blue data for the same pixel. This will be followed by red, green, and blue data (RGB data) for the next pixel and so forth. This is continued for each of the pixels in a particular line in the image, followed by the next subsequent line in the image, and so forth. The data is typically delivered at an almost even rate throughout the time allotted for the display of a frame, except for short horizontal blanking intervals at the end of each line and a short vertical blanking period at the end of each frame. For example, in the CCIR 601 and CCIR 656 standard video signals, the horizontal blanking occupies approximately 17% of the time allotted to each line (which time is on the order of 60 µs), while the vertical blanking occupies approximately 8% of the frame time. The remainder of the time, data is being delivered for display. Field sequential color displays, on the other hand, typically require first the red data for each of the pixels in the image, followed by the green data for each of the pixels in the image, followed by the blue data for each of the pixels in the image. In the simplest sequential-color display illumination schemes, the entire display is illuminated with a single primary color at one time. In this case, all the data for a given primary color must be written to the pixels before the illumination can commence, which further aggravates the data-supply problem, requiring that the data be provided to the display at a high rate for a short interval of time, to avoid unduly reducing the illumination duty factor. For these reasons, field sequential color microdisplay systems require additional circuitry to receive the data in one format and supply it to the microdisplay in a different format. This format conversion necessarily requires a considerable amount of buffer memory—at least the substantial fraction of a memory capable of storing all the red, green, and blue data for all the pixels in the displayed image. With moving images, additional buffer memory is required to prevent the "tearing" artifact illustrated in FIG. 17. The figure illustrates the image on a sequential-color display, the display being refreshed from a single frame buffer that is simultaneously being updated with a new incoming frame. The depicted object is moving (horizontally, in this example), which causes its position to change from frame to frame. Since the display refresh rate is different (i.e. three or more times higher) than the update rate, the refresh and the update cannot be entirely synchronized, and it is therefore unavoidable that portions of the image data corresponding to a present frame and to a previous frame appear simultaneously on different regions of the display. Horizontal lines along which there is a mismatch in the position of the displayed object separate these regions. The object's details or texture will appear to be "torn" along these lines. This artifact is quite obvious and objectionable to the average viewer. Avoiding it requires double buffering the image data, i.e., using one buffer memory to store and display the previous frame, while a second buffer memory is updated with incoming image data. The role of the two buffers is reversed between incoming frames.

One way to provide the needed additional data reformatting or reordering and image buffer circuitry practiced in the art is to supply it on semiconductor chips separate from the microdisplay. A disadvantage of this separate interface chip approach is the increased cost due to the need for the microdisplay system to have additional chips, for example one extra chip for the data format conversion and another dedicated to image buffering memory. A further disadvantage is the increased size of a multiple-chip display system. Finally, off-chip buffering further requires high-bandwidth communication between the buffer chip and the microdisplay, which invariably produces increased power consumption.

An alternative location for the needed circuitry and buffer memory is on the microdisplay backplane itself, perhaps within the pixel array. However, the large amount of backplane circuitry required to effect image buffering prevents practical implementations, since the resulting backplane would be so large and hence expensive. If the frame buffer was simply a memory block separate from the pixels, but still on the microdisplay backplane, the ratio of pixel array area to total backplane area would be undesirably reduced, since it would be impractical for the pixels to cover the memory block area. Alternatively, the circuit architecture of the microdisplay pixels could be designed so that the needed buffer memory for a given pixel was part of the circuitry physically associated with and underneath that pixel. Although this doesn't solve the overall backplane size problem, it does avoid the unfavorable active-area ratio problem of a separate memory block, since the pixels now cover the memory circuits. However, this benefit comes at the price of introducing another substantial problem. The failure of any of the memory registers produces visible pixel defects. Redundancy techniques used in the semiconductor memory art to improve yield by "mapping" around the address of defective registers cannot easily be used to compensate for such pixel failures, since a defective pixel at one location cannot be replaced by a functioning pixel at a different location.

The backplane size problem could be addressed by specialized CMOS silicon fabrication processes, such as embedded DRAM processes, but these processes are more expensive to fabricate. Further, DRAM requires constant refreshing, which adds substantial unwanted power consumption.

The impracticality of prior-art techniques for providing the desired fully digital sequential-color format conversion entirely within a microdisplay backplane can best be illustrated by an example. For purposes of illustration, consider a microdisplay capable of displaying sequential full color, with eight bits of gray scale per color. Consider further that the microdisplay utilizes a double image buffer, with the buffer circuitry located within the pixel, to eliminate visual artifacts and to allow high color field rates. Although the layout size of an arbitrary pixel circuit cannot be determined exactly without carrying out a complete design, its lower bound can be estimated by assuming that its transistors are laid out with the same density as transistors in a standard six-transistor SRAM cell. Given that the design rules and layout for standard SRAM cells are highly optimized, it is very unlikely that arbitrary pixel circuits could be laid out with higher density. In a survey of leading CMOS silicon foundries performed by the applicant, it was found that the area of optimized six-transistor SRAM cells offered by the foundries was generally larger than 130 $f^2$, where f designates the CMOS process ground rule (usually the finest feasible half-pitch for polysilicon lines in the specified process). For example, in a 0.35 µm CMOS process, six-transistor SRAM cells generally had areas of about 16 $\mu m^2$. The formula a=130 $f^2$ produces an SRAM area estimate slightly larger than that estimated for future processes and future years in the "International Technology Roadmap for Semiconductors 2002 Update", sponsored by (among others) the United States' Semiconductor Industry Association.

Figure 18:
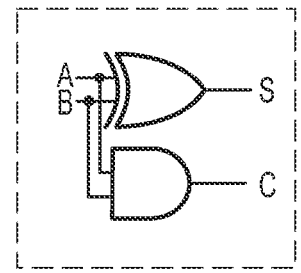
FIG. 18 is an illustration of portions of logic for implementing PWM gray scale in digital hardware.
Figure 18:
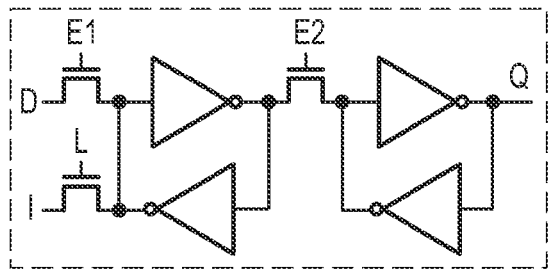
Figure 18:
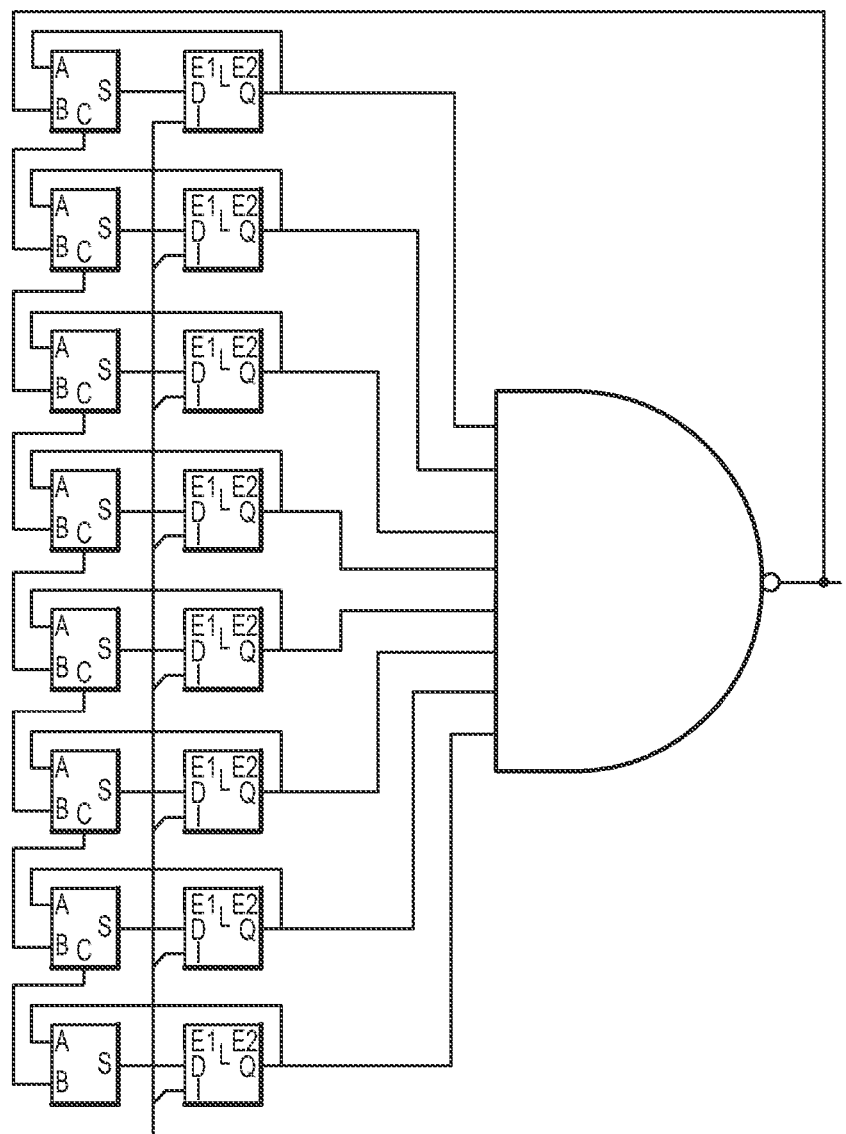

In-pixel buffering and re-ordering of image data could conveniently be accomplished with shift registers, as is known in the sequential-color display art. Standard CMOS shift register cells comprising two static latches (each latch further comprising four transistors in the form of cross-coupled inverters) and two transmission gates (each transmission gate comprising two transistors) require twelve transistors per stored bit. Thus, double-buffering 24 bits of image information requires 48×12=576 transistors. If these transistors could be laid out with a density matching that of the highly optimized standard SRAM cells, they would occupy 1536 $\mu m^2$ in a 0.35 µm CMOS process. Thus, just the transistors associated with the image buffer would limit the minimum achievable pitch of square microdisplay pixels to 39.2 µm for this candidate CMOS process. It is known in the sequential color display art that a stored digital image value can be converted to a pixel-duration signal (in effect, a PWM drive signal) by using a down counter. Each stage of the counter can be conventionally implemented using a half-adder and a master/slave flip-flop, with a NAND gate to detect the zero condition, as shown in FIG. 18. The half-adder includes an eight-transistor XOR gate plus a four-transistor AND gate, the master stage includes four transistors arranged as cross-coupled inverters plus a load transistor and an enable transistor; the slave stage is the same, minus the load transistor. The NAND gate requires two transistors per input. Thus, the counter requires 25 transistors per bit, which, for an eight-bit gray scale translates into a total of 196 transistors, after four transistors in the unused AND gate at the zeroth stage of the counter are discarded. In total, then, this double-buffered PWM implementation of 24-bit color display requires 576+196=772 transistors. This estimate ignores miscellaneous transistors needed for pixel selection, and so on. In the aforementioned 0.35 µm CMOS process, this 772-transistor pixel would require more than 2050 $\mu m^2$, which would limit achievable square-pixel pitch to 45 µm. This pixel size estimate can be contrasted with pixel pitches found in current commercial microdisplays, which range around 12 µm. Thus, straightforward implementation of digital sequential-color format conversion results in pixels with areas more than 10 times larger than commercially competitive. For a given display resolution, a large pixel size results in a large backplane die size, which correspondingly results in few backplane die per silicon wafer and low backplane die yield, compounding to give an undesirably high backplane die cost.

It may be appreciated that techniques for reducing the number of bits needed for an image might reduce the complexity and size of a microdisplay backplane. For example, image compression techniques such as JPEG compression can be used to reduce the amount of memory needed to store an image. However, these techniques typically require complex numerical processing logic, whose additional size offsets any savings in required memory.

The number of image-data bits that must be stored can also be reduced through the technique of constraining the number of colors the display is capable of showing to a "palette" smaller than the full 16.7 million shades available at the full twenty-four bits per pixel. For example, if the number of shades were restricted to 65,536 shades, then the number of bits needed to be stored could be reduced from twenty-four per pixel to sixteen per pixel, with a consequent reduction in backplane complexity. Palettizing the image, though, produces undesirable image artifacts of its own, particularly for continuous-tone image content such as is found in photographs or videos of natural scenes, since it makes it difficult to portray smooth color and brightness variations. This problem is greatly exacerbated for PWM pixel modulators, which produce a linear relationship between display brightness and input image value. Further reduction of the input-value palette to 16 bits would result in a palette displayed at γ=1 equivalent to $2^{10}$=1024 colors on a γ=2 display, unsuitable for almost any application.

System Elements

Figure 1:
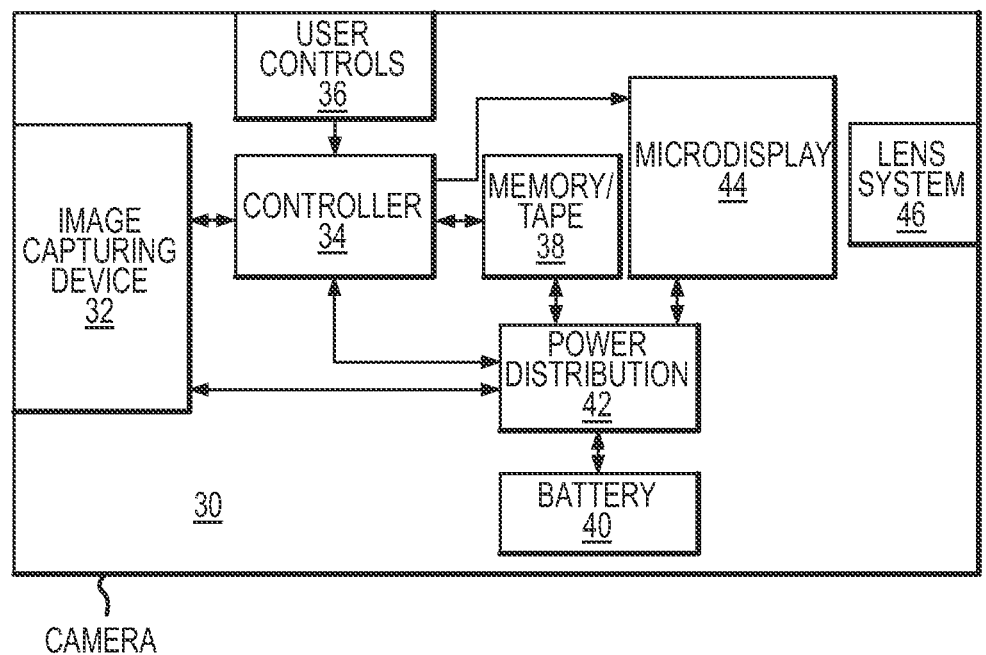
FIG. 1. is a block diagram of a camera in which the microdisplay of the present invention could be employed.

With this in mind, we can now discuss the present invention. One example of an application in which the present invention may be employed is a camera 30, as shown in FIG. 1. The camera 30 may be a video camera, a digital still camera, or another type of camera. The camera 30 may include an image-capturing device 32 that is capable of creating electrical signals representative of an image that a user may desire to record. The electrical signals are passed from the image-capturing device 32 to a controller 34 which controls the function of the camera 30. The camera 30 also includes user controls 36 that the user may use to select modes of operation of the camera 30. The controller 34 has the ability to store the electronic signals representative of the images in a storage device such as memory/tape unit 38. In the case of a video camera, this may typically be a videotape, while in the case of a digital still camera, this may typically be some type of electronic, non-volatile memory. The camera 30 also includes a battery 40 that supplies power to the components of the camera 30 via a power distribution unit 42. The stored electronic representation of the images can be converted to visual images by a microdisplay 44 that may be viewed by the user via a lens system 46 or reflective magnifier. While this is one example of an application in which the microdisplay of the present invention may be utilized, it is only exemplary in nature and is not intended to limit in any fashion the scope of the invention.

Figure 2:
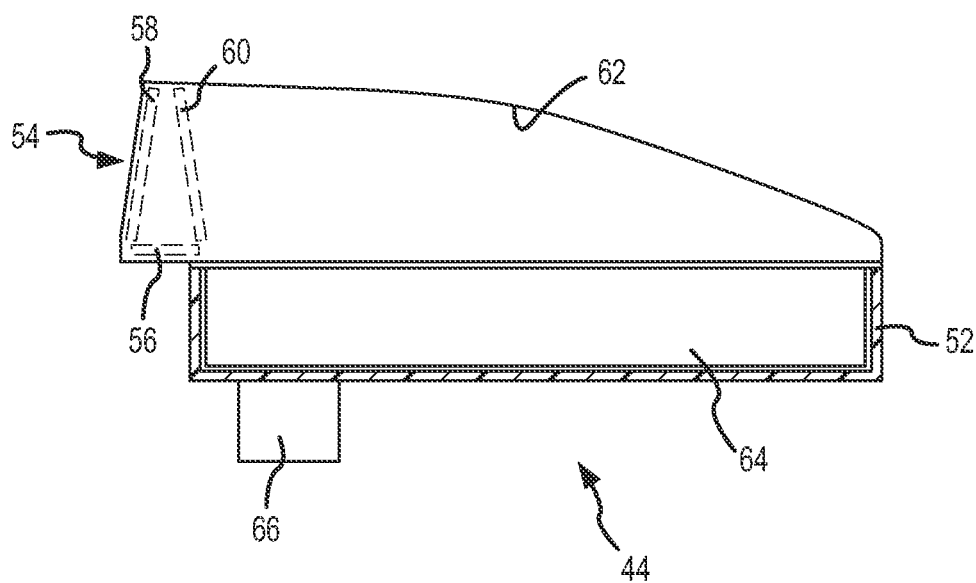
FIG. 2 is a side view of the microdisplay of the present invention showing a portion of the plastic packaging cut away to reveal an LCOS unit of the microdisplay of the present invention.

The microdisplay 44 is shown in FIG. 2 to illustrate its major components. The microdisplay 44 includes a plastic package housing 52 to which an illuminator housing 54 is attached. The illuminator housing 54 houses a tri-color LED 56 and a reflector 58 that collects light emitted by the LED 56. The light then passes through a pre-polarizer and diffuser 60 to minimize stray light of unwanted polarization and to create even illumination. The diffuse, polarized light is directed toward a polarizing beam splitter (PBS) 62, which reflects light of one linear polarization while rejecting light of an orthogonal linear polarization. The reflected light is directed down toward a liquid crystal on silicon (LCOS) display panel 64 that resides in the package housing 52. As will be described in further detail below, the display panel includes an array of pixels that can be electronically controlled into one of two different light-modulating states. In one light-modulating state, the incoming polarized light is reflected back toward the PBS 62 with the same polarization. In another light-modulating state, the light is reflected back toward the PBS 62 with its linear polarization rotated by 90°. As can be appreciated, the PBS 62 will reflect the reflected light that has not had its polarization rotated, while the light that has been rotated in polarization will pass through the PBS 62 for viewing by the user via the lens system 46. A connector 66 depends downward from the package housing 52 for electrical connection to the camera 30 such as via a flex cable.

The above discussion of the operation of the display panel 64 is not intended to limit the present invention, as other types of spatial light modulators could also be utilized in the present invention, such as spatial light modulators depending on miniature mechanical mirrors, for example. Also, display panels that emit their own light could be used. In addition, while the discussion involves linearly polarized light of two different orthogonal directions, it is also possible to utilize the present invention in a system in which unpolarized light or different types of polarization are used. Further details on the operation of liquid crystal spatial light modulators can be found in U.S. Pat. Nos. 5,748,164, 5,808,800, 5,977,940, 6,100,945, 6,507,330, 6,525,709, and 6,633,301, the contents of each of which are incorporated herein by reference.

Display Panel Detail

Figure 3:
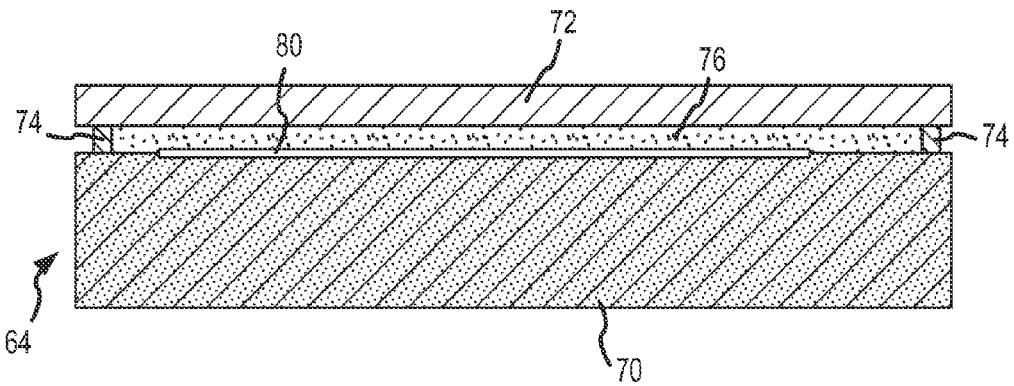
FIG. 3 is a cross-sectional view of the LCOS unit of FIG. 2.
Figure 4:
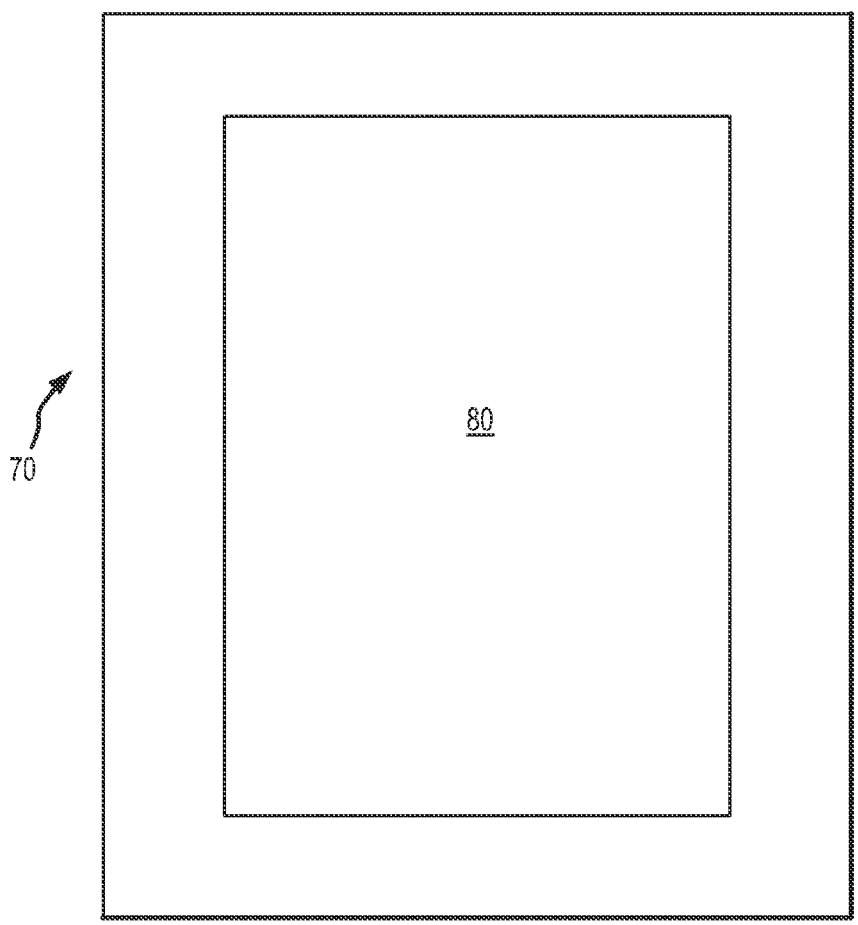
FIG. 4 is top view of the silicon backplane of the LCOS unit of FIG. 2.

The display panel 64 is shown in greater detail in FIGS. 3 and 4. As shown in FIG. 3, the display panel 64 includes a silicon backplane 70 to which a sheet of glass 72 has been affixed via glue seal 74. Sandwiched between the silicon backplane 70 and the sheet of glass 72 is a layer of liquid crystal material 76. When viewed from a different side, it may become clear that the glass 72 and the backplane 70 are offset slightly in one direction to allow there to be a slight overhang of glass on one side and a slight overhang of silicon on the opposite side. The liquid crystal material 76 may include any of several types of liquid crystals including, but not limited to, ferroelectric, nematic, or other types of liquid crystals. In this embodiment, ferroelectric liquid crystals are utilized. Alternatively, other types of display devices such as digital micromirror and other microelectromechanical devices, plasma displays, electroluminescent displays, light-emitting diodes, and the like could be employed as part of the display panel. As can be appreciated, these alternatives may either be spatial light modulators that modulate light from a light source or they may be light emissive devices that do not require a separate light source.

The silicon backplane 70 includes an area on a top surface thereof where an array 80 of reflective pixel electrodes is located. As can be appreciated, the image is formed in this area of the display panel 64, which is known as the "active area" of the display panel. The silicon backplane 70 is shown in FIG. 3 to be formed of solid silicon material solely for ease of illustration of the major components of the display panel 64. In actuality, a plurality of circuits, conductors, and so forth exist within the silicon backplane 70, as will be discussed in further detail below.

Figure 5:
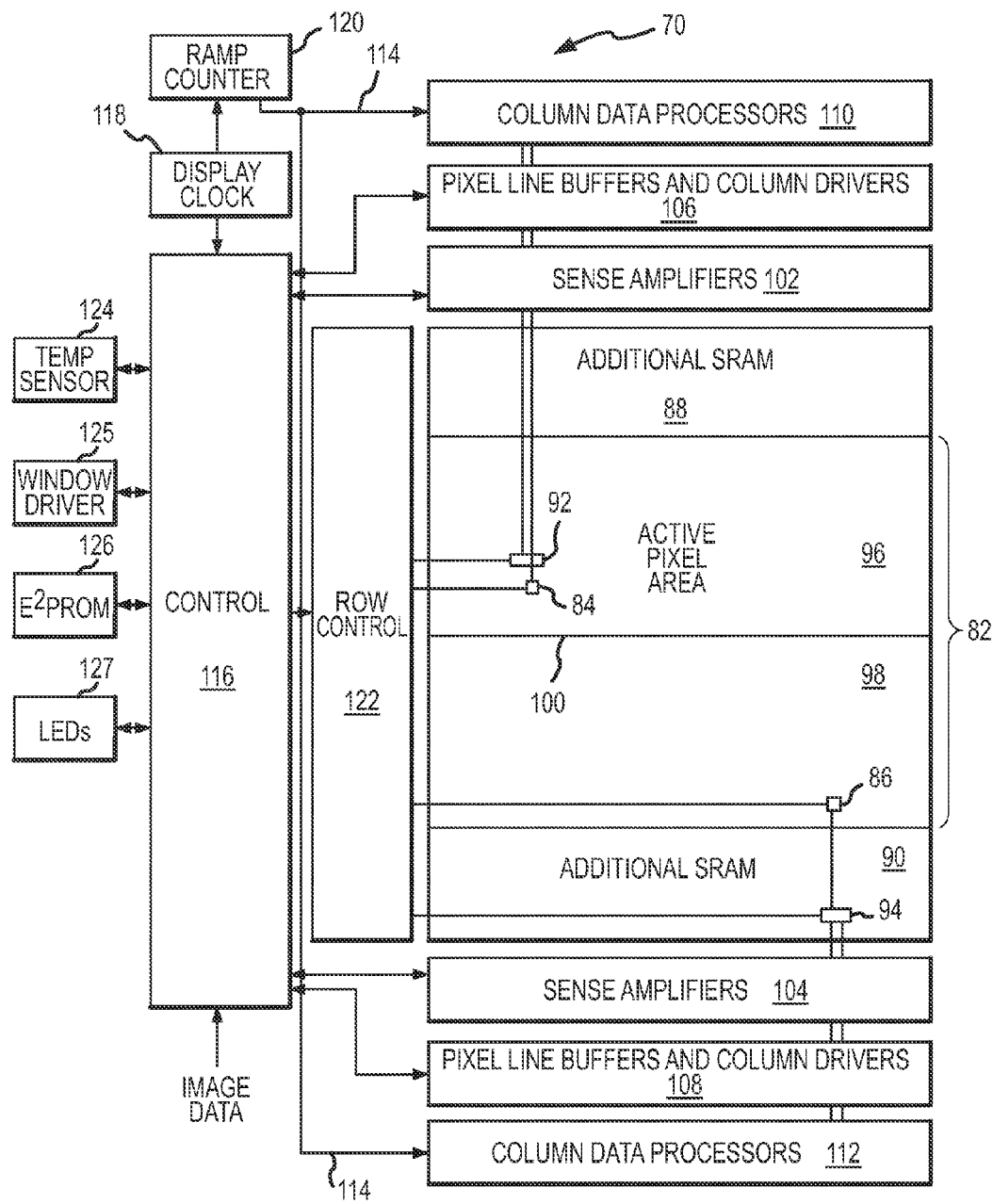
FIG. 5 is a block diagram of portions of the silicon backplane of FIG. 4.

FIG. 5 is intended to represent certain significant portions of the silicon backplane 70 in a functional manner and components that interface with the backplane 70, rather than in a positional manner. The silicon backplane 70 has an active pixel area 82 that includes a plurality of rows and columns of pixels. Two pixels are shown in the active pixel area 82, a first pixel 84 and a second pixel 86. Located within the silicon backplane under the array 80 of reflective pixel electrodes is circuitry (that will be discussed in further detail below), a major component of which is a plurality of memory cells underneath the active pixel area 82 and optionally extending beyond the boundary of the active pixel area 82 vertically as viewed in FIG. 5, where additional regions 88 and 90 of memory cells are shown. In the present embodiment, these memory cells are implemented as conventional six-transistor SRAM, although other types of memory registers, including dynamic registers, could be used as well. Two particular areas of memory cells are illustrated in FIG. 5, a first area 92 of SRAM and a second area 94 of SRAM. As will be seen, the first area of SRAM 92 is functionally associated with the first pixel 84 and the second area of SRAM 94 is functionally associated with the second pixel 86, although the areas of SRAM 92 and 94 are not located next to the first and second pixels 84 and 86. A second major component is a plurality of boost circuits which are capable of storing data as an SRAM cell as well as being able to drive a particular voltage onto a pixel electrode as commanded by the data stored in the boost cell.

In this embodiment, an upper-half 96 of the active pixel area 82 is associated with one set of circuitry shown in FIG. 5 above the active pixel area 82, while a lower-half 98 of the active pixel area 82 is associated with circuitry shown in FIG. 5 below the active pixel area 82. In this case, the upper half 96 and lower half 98 are divided along a dividing line 100 shown in FIG. 5. As will be discussed in further detail below, the additional circuitry above and below the active pixel area 82 that is associated with the upper and lower halves 96 and 98 are a pair of banks of sense amplifiers 102 and 104 respectively, a pair of banks of pixel line-buffers and column drivers 106 and 108 respectively, and a pair of banks of column data processors (CDPs) 110 and 112, respectively. The sense amplifiers in the banks 102 and 104 read the contents of the SRAM memory cells for use by the column data processors of the banks 110 and 112. The pixel line-buffers of the banks 106 and 108 temporarily store data on the way to the SRAM, include a circuit to drive the columns of the SRAM, and provide a mechanism to selectively drive only particular columns of the SRAM. The column data processors of the banks 110 and 112 receive data read back by the sense amplifiers from the SRAM, decompress and compare the data to a ramp signal 114, to determine when and how pixel electrodes of pixel array 82 should be driven so as to generate a displayed image.

A control unit 116 in the silicon backplane 70 receives image data provided to the microdisplay 44 such as image data that may come from controller 34 of the camera 30 in any one of various formats. The control unit 116 is operative to accept image data in at least three different standard video formats, including RGB serial, CCIR-601, and CCIR-656. In each of these standard formats, the image data associated with all three primary colors is transmitted for a given pixel before any image data is transmitted for the next pixel. The timing for each of these video formats can be NTSC or PAL and the vertical frequency can be either 50 Hz or 60 Hz. The resolution of the RGB serial data may be 432×240 while the resolution for the CCIR video formats may be either 720×242 or 720×288. The invention is not limited to any particular format, timing, vertical frequency, resolution, or geometry. The invention can further provide an analog to digital converter in the input data path, to allow the display to accept standard analog video signals, and provide digital data to the remainder of the display. The control unit is operative to perform gamma correction, dither, and scaling on the received images as may be necessary and appropriate. For example, if the column data processors and SRAM array were acting together to produce a PWM gray-scale with γ=1, as will be described in more detail below, and the received image data were provided from a standard source designed to drive a γ=2 display, the control unit could transform the incoming digital values to new values such that when displayed a viewer would perceive a correct gamma characteristic. In the present embodiment, this is accomplished by transforming the incoming 8-bit/color data to 10-bit/color data with the desired gamma correction. In order to display this data within an 8-bit/color limitation of one embodiment of the present invention, the 10-bit/color data is converted to 8-bit/color data using a Floyd-Steinberg error-diffusion algorithm carried out within control block 116 to minimize the visibility of any errors resulting from lack of precision with which the 10-bit values can be represented. Additionally, the control block 116 can horizontally and vertically scale the incoming image data (which might have, for example, 720×242 or 720×288 formats) using bilinear interpolation to a 432×240 format matching the format of the pixel array.

The control unit 116 receives a clock signal from a display clock 118. The clock signal from the display clock also drives a ramp counter 120 that supplies the afore-mentioned ramp signal 114. The control unit 116 controls row control logic 122, which selects which row of the pixels and which SRAM cells will be accessed. The control unit 116 also communicates with a variety of peripheral circuit elements, some of which may be located separately from the backplane 70. These elements include a temperature sensor 124, a window driver 125, a pixel-voltage generator, one or more LED drivers, one or more digital-to-analog converters (DACs), one or more analog-to-digital converters (ADCs), a non-volatile memory such as an EEPROM 126, and a set of LEDs 127.

Figure 6:
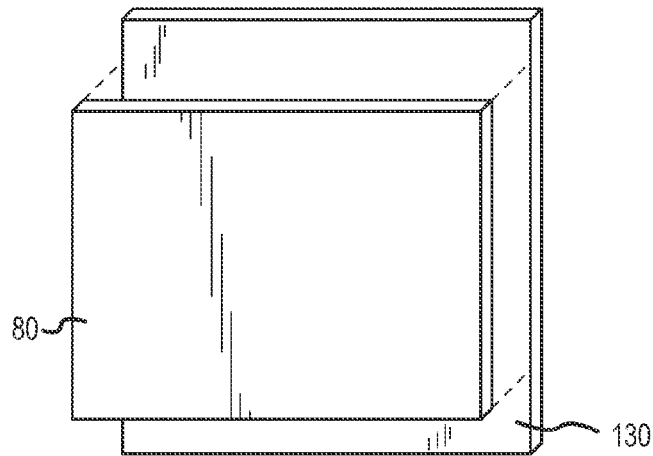
FIG. 6 is a perspective view of portions of the silicon backplane showing the size relationship between the pixel array and the layer of boost circuits and SRAM memory cells.

FIG. 6 shows the size relationship between the array of pixel electrodes 80 in the layer 130 of SRAM memory cells and the pixel-driving boost circuits lying therebeneath. As can be appreciated, in one dimension, the pixel array 80 and the layer 130 underneath are the same width, while in another dimension, the layer 130 is significantly taller than the pixel array 80. As illustrated in FIG. 5, this is because of the additional SRAM 88 and 90 that is utilized in this particular embodiment.

Figure 7:
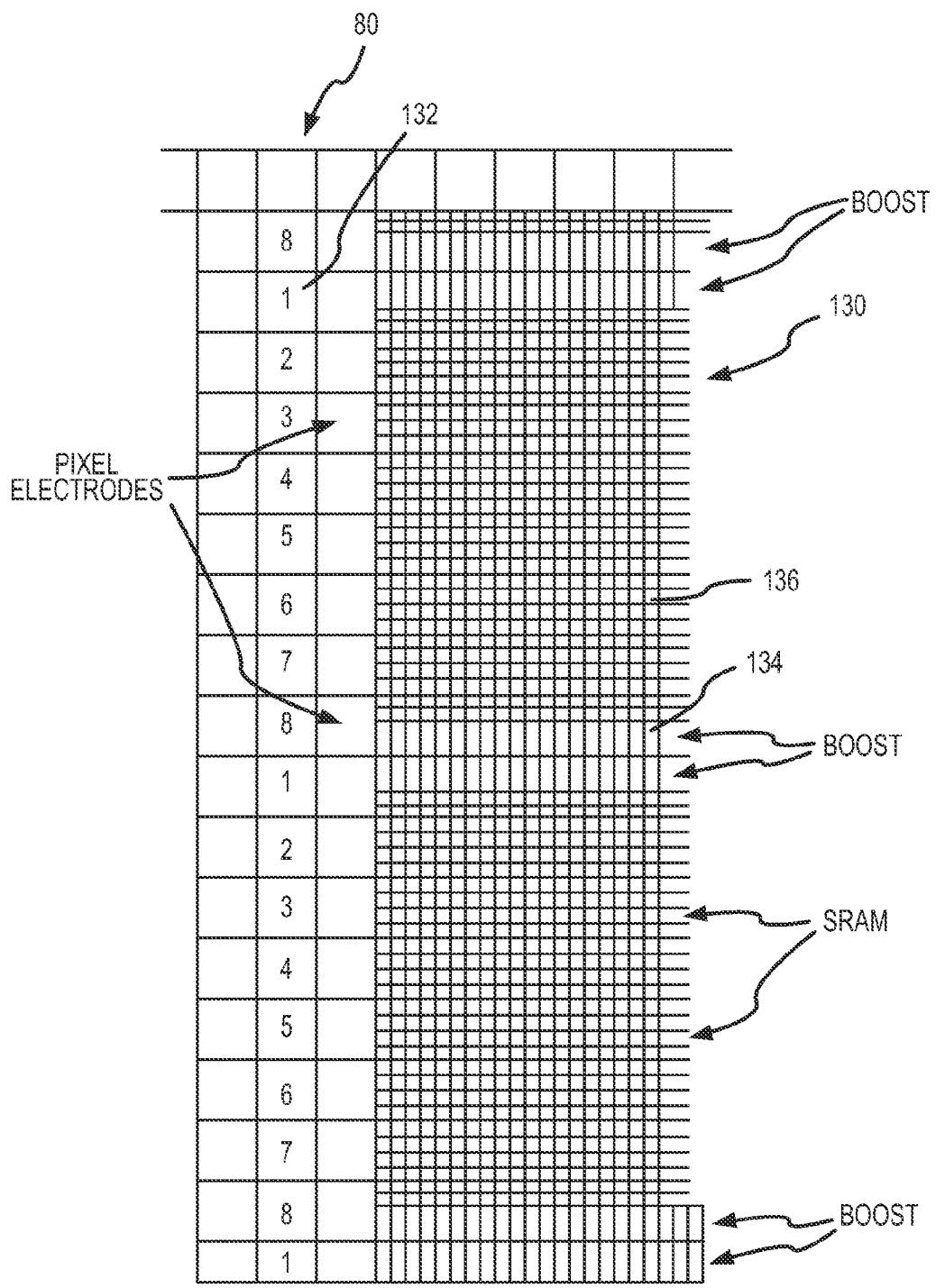
FIG. 7 is a functional representation of a portion of the silicon backplane of the present invention.
Figure 8:
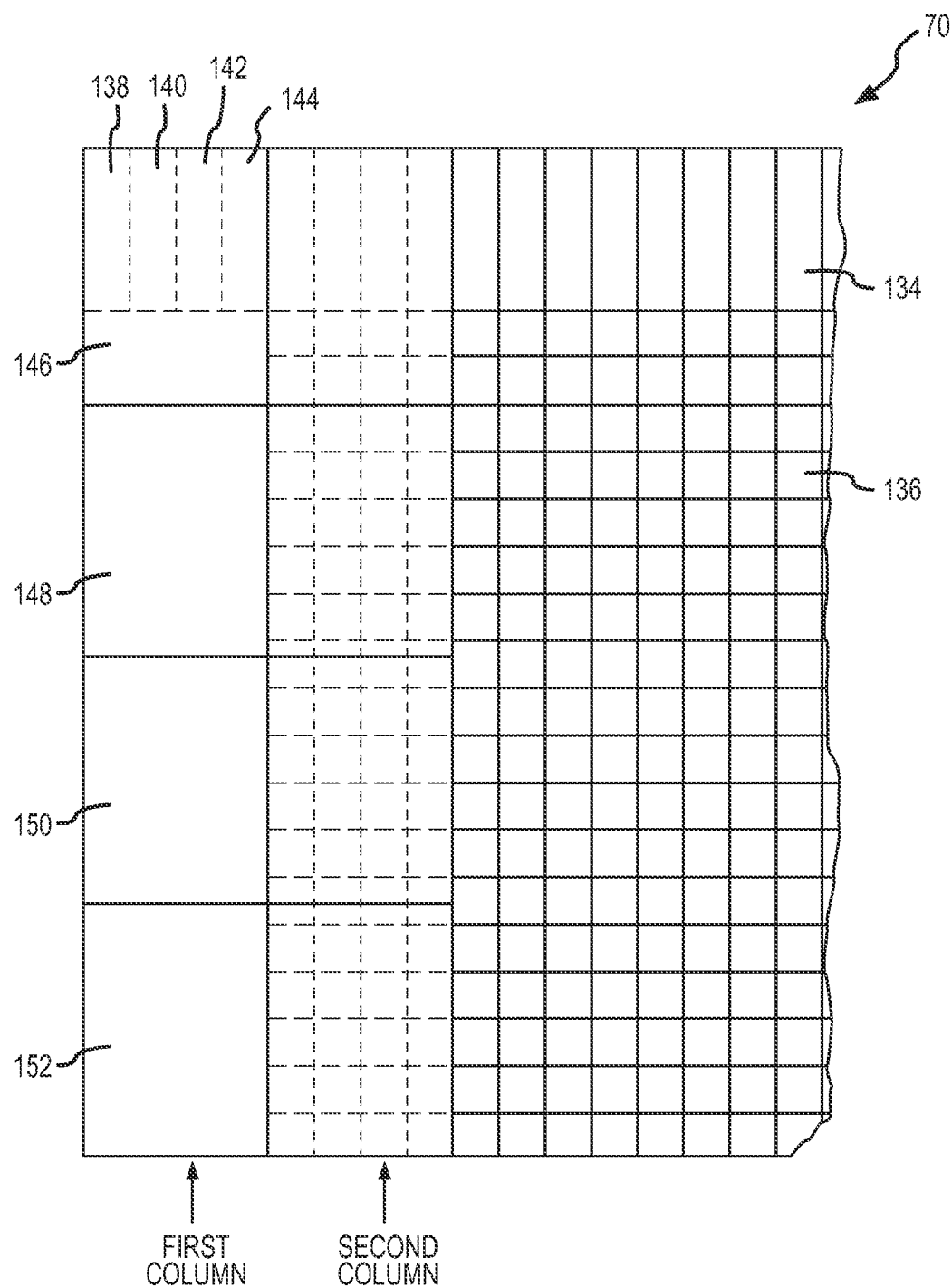
FIG. 8 is a larger-scale functional representation of a portion of the silicon backplane of the present invention.

FIG. 7 illustrates the positional relationship between the pixel array 80 and the layer 130. For purposes of illustration, portions of the pixel array 80 have been removed to expose portions of the layer 130 therebeneath. In this embodiment, each of the pixel electrodes 132 is one of a group of eight adjacent pixel electrodes in a single column, as shown in FIG. 7. The layer 130 underneath the pixel array 80 includes a plurality of rows of boost circuits 134 and a plurality of SRAM memory cells 136. As can be seen, the boost circuits 134 are grouped together in pairs of adjacent rows, separated by approximately thirty rows of SRAM memory cells 136. Further, the boost circuits 134 are located in this embodiment in a particular position relative to each of the pixel electrodes 132, while SRAM occupies the remaining area between boost circuits. The location of data in SRAM cells relative to boost circuits and pixels in which that data will be eventually displayed is essentially arbitrary. These relationships, or lack thereof, can be better appreciated in FIG. 8. On the left side of FIG. 8, eight pixel electrodes, of which four 146, 148, 150, and 152 are in a first vertical column and another four are in a second vertical column, can be seen with a plurality of boost circuits 138, 140, 142, and 144 shown in phantom underneath the pixel electrode 146. Additional boost circuits and SRAM memory cells are shown in phantom underneath the second vertical column of pixel electrodes. At the right side of FIG. 8, the silicon backplane 70 is seen with the pixel electrodes removed to directly expose a plurality of pixel boost circuits 134 and SRAM memory cells 136.

In this embodiment, a group of four particular boost circuits 138, 140, 142, and 144 in a particular row are associated with four particular pixel electrodes 146, 148, 150, and 152 in a particular column. Since the boost circuits occupy a space that is approximately ¼ of the width of a pixel electrode, the four boost circuits 138, 140, 142, and 144 lie underneath a single one 146 of the pixel electrodes. In this embodiment, boost circuit 138 is associated with and drives pixel electrode 146, boost circuit 140 is associated with and drives pixel electrode 148, boost circuit 142 is associated with and drives pixel electrode 150, and boost circuit 144 is associated with and drives pixel electrode 152. As can be appreciated, the remaining space under pixel electrode 146 and all of the space under pixel electrodes 148, 150, and 152 is occupied by a plurality of SRAM memory cells 136. With this particular sizing of the pixel electrodes 132, however, and the particular semiconductor fabrication process used, the remaining space under particular pixel electrodes 146, 148, 150, and 152 is not sufficient for the buffered storage required by this design for those four pixel electrodes. For this reason, additional space vertically above and below the pixel array 80 is used for additional SRAM 88 and 90 in the layer 130 as shown in FIGS. 5 and 6.

Referring back to FIG. 7, it can be appreciated that the bottom row of each adjacent two rows of boost circuits 134 is associated with and drives four pixel electrodes—the pixel electrode in that same column that is located directly on top of the bottom row of boost circuits and the three adjacent pixel electrodes lying therebeneath in the same column. Similarly, the upper row of each pair of boost circuits 134 is associated with and drives four pixel electrodes—the pixel electrode in that same column that is located directly on top of the upper row of boost circuits and the three adjacent pixel electrodes vertically above in the same column.

As previously described, in this embodiment more SRAM storage is required than will fit beneath the active pixel array, in the space between the boost circuits. For this reason, the SRAM extends beyond the active pixel array 80 as indicated in FIG. 6. It can be appreciated then, that there exists no specific relationship between a pixel electrode of the active pixel array and the SRAM locations where data for that pixel is stored, other than that the SRAM used must reside in the same vertical slice as the pixel electrode, which will be explained further on.

It can be appreciated that the lack of a specific relationship between the location of the particular SRAM memory cells 136 and a particular pixel electrode 132 is advantageous because it allows the microdisplay 44 to utilize SRAM memory cells that are in the additional SRAM areas 88 and 90 as a memory buffer for image data to be displayed on a pixel electrode anywhere in the pixel array 80. In addition, should it be determined that particular SRAM memory cells 136 or rows of SRAM memory cells are defective, spare SRAM memory cells or rows of SRAM memory cells located elsewhere in the silicon backplane 70 can be utilized as a memory buffer for that particular pixel electrode 132. The address location of the bad cells or rows can be stored at the time of an external die test in the EEPROM non-volatile memory associated with the microdisplay, or determined by a built-in self-test function that launches when the microdisplay is powered up and stored in volatile registers in the microdisplay. Logic within the control block 116 can retrieve and interpret the addresses of the bad cells or rows, and automatically substitute the addresses of suitable spare cells or rows.

Column Data Processor and its Functions

Figure 9:
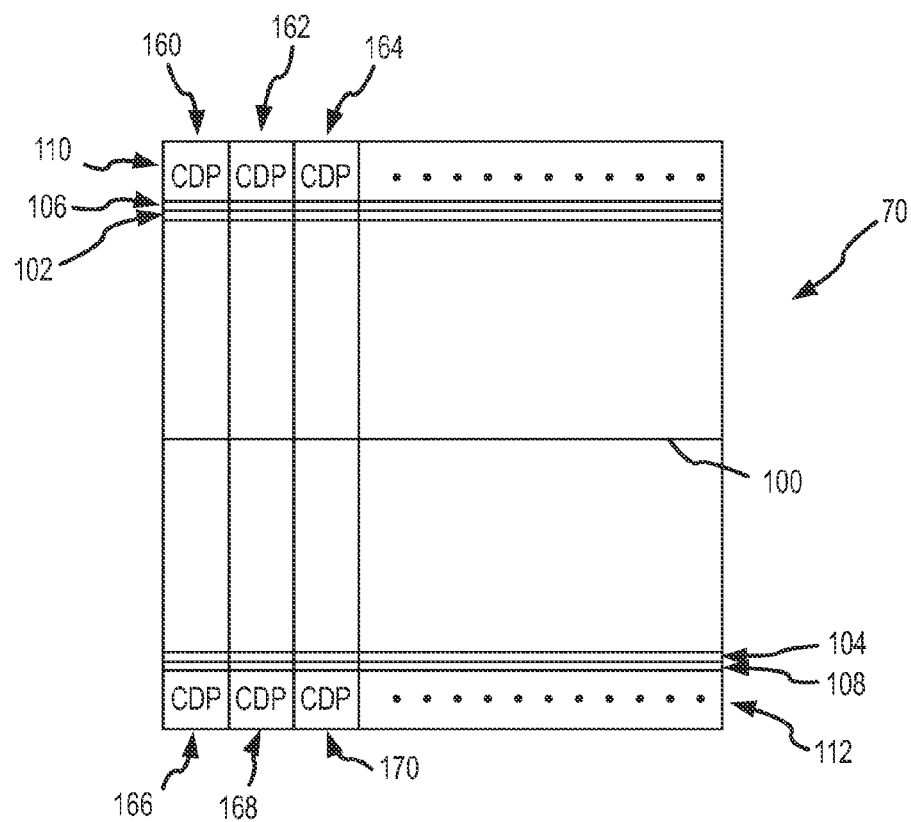
FIG. 9 is a functional representation of a portion of the silicon backplane of the present invention, showing the CDP slices.

Portions of the silicon backplane 70 are illustrated in FIG. 9. As has been previously discussed, the silicon backplane 70 is divided into an upper half and a lower half by a dividing line 100. The upper half includes a horizontal bank 102 of sense amplifiers, a horizontal bank 106 of pixel line buffers and column drivers, and a horizontal bank 110 of column data processors (CDPs). Further, it can be seen that this portion of the silicon backplane is divided into vertical slices, of which three of the slices, 160, 162, and 164 are shown. Each vertical slice has its own CDP and associated pixel line buffers and column drivers from the bank 106 as well as associated sense amplifiers from the bank 102. The CDP of a particular slice performs the data processing for each of the pixel electrodes in that given slice. On the other side of the dividing line 100, similar CDP slices 166, 168, and 170 are shown. Each of these slices 166, 168, and 170 include a single CDP and associated pixel line buffers and column drivers from the bank 108 and associated sense amplifiers from the bank 104.

SRAM Reading and Writing

Figure 10:
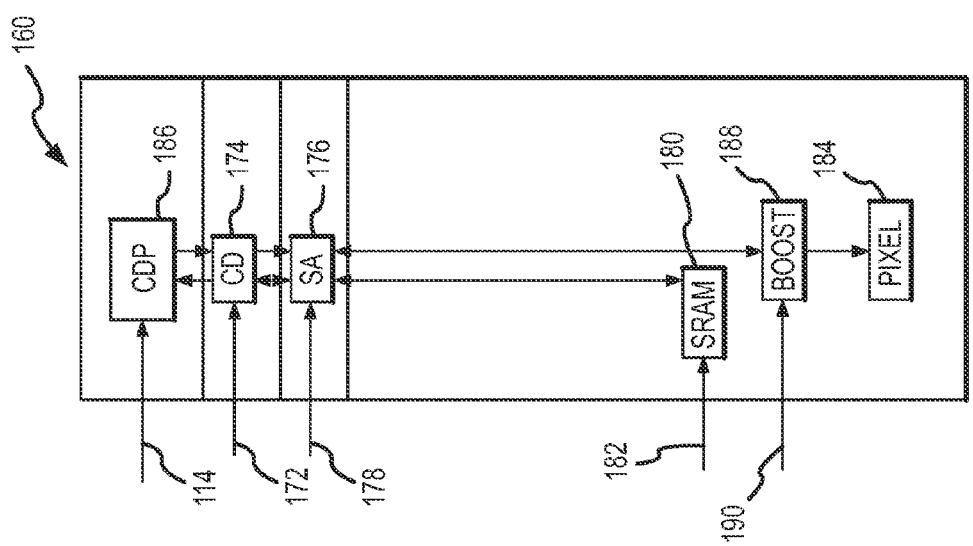
FIG. 10 is a functional view of a single CDP slice of the silicon backplane of the present invention.

FIG. 10 shows a functional representation of the CDP slice 160. Encoded image data 172 from the control unit 116 is provided to a column driver 174 in the slice 160. The column driver 174 passes data past a sense amplifier 176 (which is deselected via a signal 178 for this write operation) to a plurality of SRAM memory cells 180. The particular SRAM memory cell in which the data is stored is determined by the particular column driver 174 and a row enable signal 182 from the row control unit 122. Later, the control unit 116 will command the row control unit 122 to drive the row enable signal 182 for the row of SRAM cells 180 where the pixel electrode's data is stored and enable sense amplifier 176 by activating the sense amp enable signal 178. The sense amplifiers 176 will determine the contents of the selected SRAM cells 180 and pass the data to the CDP 186 of slice 160. The CDP 186 decompresses the data and compares selected portions of the decompressed value to the ramp signal 114, the result of which is then stored temporarily and then later written to the boost circuit 188 that is associated with pixel 184, by disabling the sense amp 176, enabling the column driver 174, and causing the row control unit 122 to drive row enable signal 190.

Digital Pulse-width-modulation Gray Scale

Figure 11:
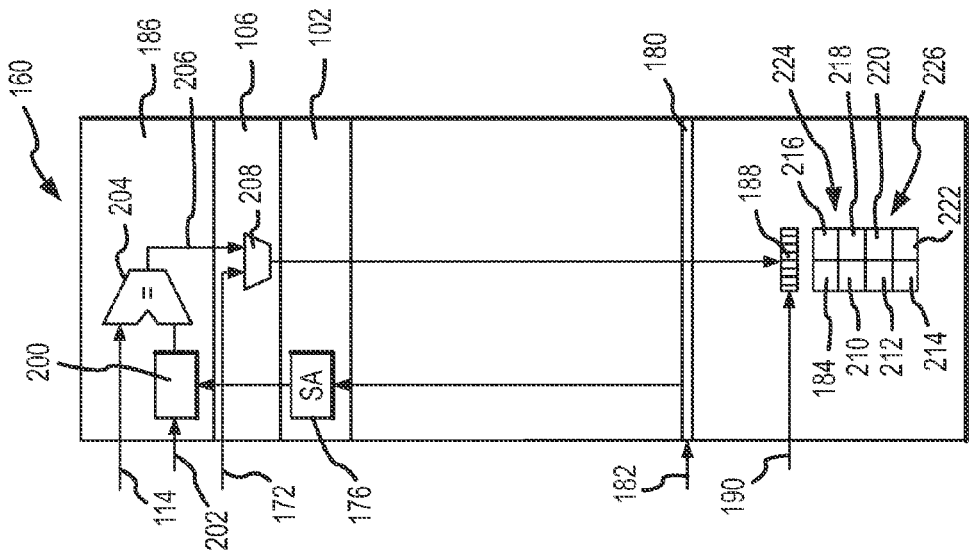
FIG. 11 is a more detailed functional view of a single CDP slice of the silicon backplane of the present invention.

FIG. 11 shows more detail about the operation of reading data from SRAM, performing a comparison and using the result of the comparison to determine when to change the state of the pixel. In this case, the SRAM memory cells are represented as an entire row of memory cells that may include 48 different memory cells in this CDP slice 160. The particular row 180 is selected by the row enable signal 182. The data from particular memory cells in the SRAM memory 180 is read by the sense amplifiers 176 and supplied to a decode block 200, which will be discussed in further detail below. The decode block 200 receives a decode signal 202 from the control unit 116. The decode signal 202 indicates which portion of the result decoded from stored encoded image data should be provided to a first input of a digital comparator 204. The comparator 204 compares this decoded portion of the encoded image value to the digital ramp signal 114 (which is provided to its second input) and provides (via logic described below in conjunction with FIG. 12) a pixel control signal 206 to a multiplexer 208 that can be controlled to enable writing of either the pixel control signal 206 or the encoded image signal to storage locations below. In this case, the pixel control signal 206 is provided to the selected boost circuit 188 that is in a group of four boost circuits in a column underneath four pixels, 184, 210, 212, and 214 (for ease of illustration, the boost circuits are not shown underneath one of the pixels in this case). Boost circuit 188 is associated with and is in electrical communication with the pixel electrode 184, whose state the pixel control signal 206 is intended to control. In this embodiment, each boost circuit functions as a one-bit storage register for the desired state of the pixel. It can be seen that eight boost circuits are shown in the row including boost circuit 188. These are grouped into 2 groups of four boost circuits, with the left-most group of four boost circuits storing the intended display value for the four pixels shown therebelow 184, 210, 212, and 214, and the right-most group of four boost circuits storing the intended display value for the four pixels 216, 218, 220, and 222 shown therebelow. For ease of later discussion, a two-by-two array of pixels 184, 210, 216, and 218 is indicated in FIG. 11 as pixel group 224 while another group of four pixels 212, 214, 220, and 222 is shown in FIG. 11 as pixel group 226.

In this particular embodiment, the pixel array 80 includes 240 pixels vertically and 432 pixels horizontally. The dividing line 100 separates this 240×432 array into two arrays of 120 pixels vertically and 432 pixels horizontally. Each of these two arrays is sliced vertically, as has been previously described, into 36 CDP slices. Each of these CDP slices includes a sub-array of 120 pixels vertically and 12 pixels horizontally. Underneath these pixels are rows of boost circuits, with 48 boost circuits in each particular row of a CDP slice, or 4 boost circuits for each column of pixels. In between the double rows of boost circuits, there are approximately 30 rows of SRAM memory cells, with there being 48 memory cells in each row of each CDP slice. This is intended as but one embodiment of the present invention, and none of the sizes or numbers discussed herein are intended to limit the invention.

Figure 12:
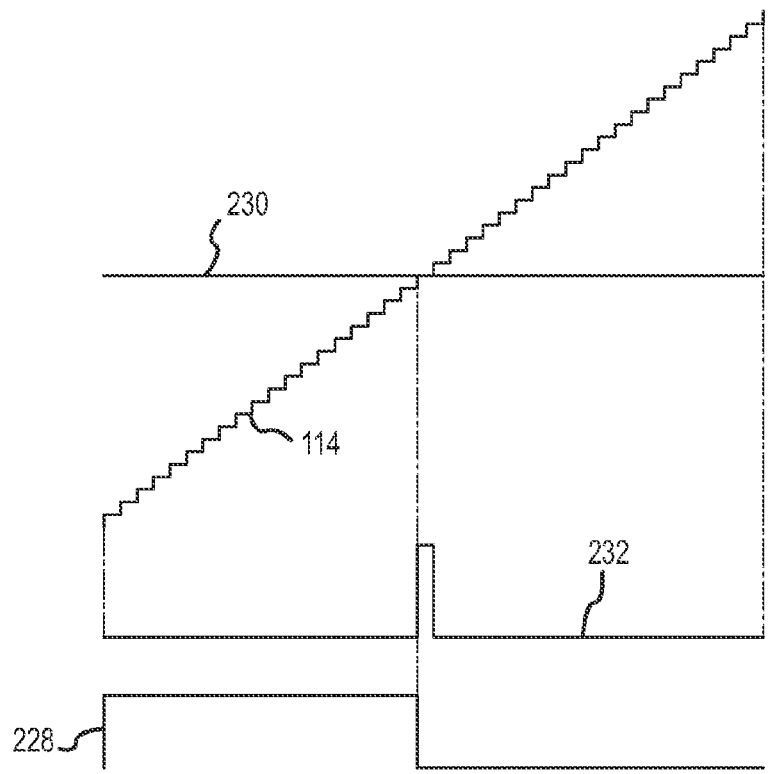
FIG. 12 is a representation of the input signals to a comparator and a resulting pixel electrical drive signal in a CDP slice of the microdisplay of the present invention.

FIG. 12 shows the signals input to the comparator 204 in the CDP slice 160, the output 232 of the comparator 204 that helps to create the pixel control signal 206, and also the resulting pixel electrical drive signal 228 that represents the state of the pixel electrode. The ramp signal 114 is one of the inputs to the comparator, while the other input is a decoded pixel value 230. The pixel electrical drive signal 228 is shown just below, on the same time scale. Both comparator input signals are digital, although they are shown pictorially in this figure in a way where vertical direction in the figure indicates value. The ramp signal 114, output by ramp counter 120, might be the output of an eight-bit counter, progressing from binary value 00000000 (digital 0) to binary value 11111111 (digital 255). Schemes other than simple counting, such as gray codes, can also be used. Further, the count can proceed in descending order as well as ascending order. As can be appreciated from the figure, when the ramp signal 114 begins, the pixel electrical drive signal 228 transitions from, for example, a low to a high state, as signaled by the pixel control signal 206. Once the ramp signal 114 reaches the same digital value as the decoded pixel value 230, the comparator output 232 goes high. This output enables column driver 174 to write to a pixel selected by row enable signal 182, thereby providing pixel control signal 206. In this case, the value of pixel control signal 206 has been selected so that the pixel electrical drive signal 228 transitions from a high state to a low state in response to the detection of equality by comparator 204. Of course, the length of time the pixel electrical drive signal 228 is in a high state relative to in a low state is a function of the magnitude of the decoded pixel value 230. In other words, for small magnitudes of the decoded pixel value 230, the high state of the pixel electrical drive signal 228 will be relatively short, while for relatively large magnitudes of the decoded pixel value 230, the pixel electrical drive signal 228 will be in a high state for a substantial majority of the time. In this way, the microdisplay 44 implements pulse-width modulation pixel drive. Of course, the sense of the PWM can be reversed (i.e. relatively long durations of pixel electrical drive signal 228 for small magnitudes of decoded pixel value 230, and so on, by simple changes to the logic circuitry). The functionality of the column data processors is accomplished via combinatorial logic such as adders, shifters, and the like.

It may be preferable for the pixel control signal 206 to be written to the boost circuits for each pixel in a different order for the top half of the display versus the bottom half of the display. For example if the signal were written to each half in the same manner, updating the image from top row to bottom row in each half, the portion of the image near the dividing lines 100 between the two halves would have portions of an old image next to a portion of the new image a substantial majority of the time. This may cause visible image artifacts. In order to avoid this, it is possible to update the top half from top row to bottom row, while updating the bottom half from bottom row to top row. This may also be called updating from outside to inside. Alternatively, the updating could be done in exactly the opposite fashion, from inside to outside, or from bottom row to top row in the top half and from top row to bottom row in the bottom half. Another alternative would be to go from outside to inside in one frame of data, from inside to outside in the next succeeding frame, and repeating in this alternating fashion. Any variations on these alternatives or any other that eliminates the visual artifacts would be acceptable.

Figure 19:
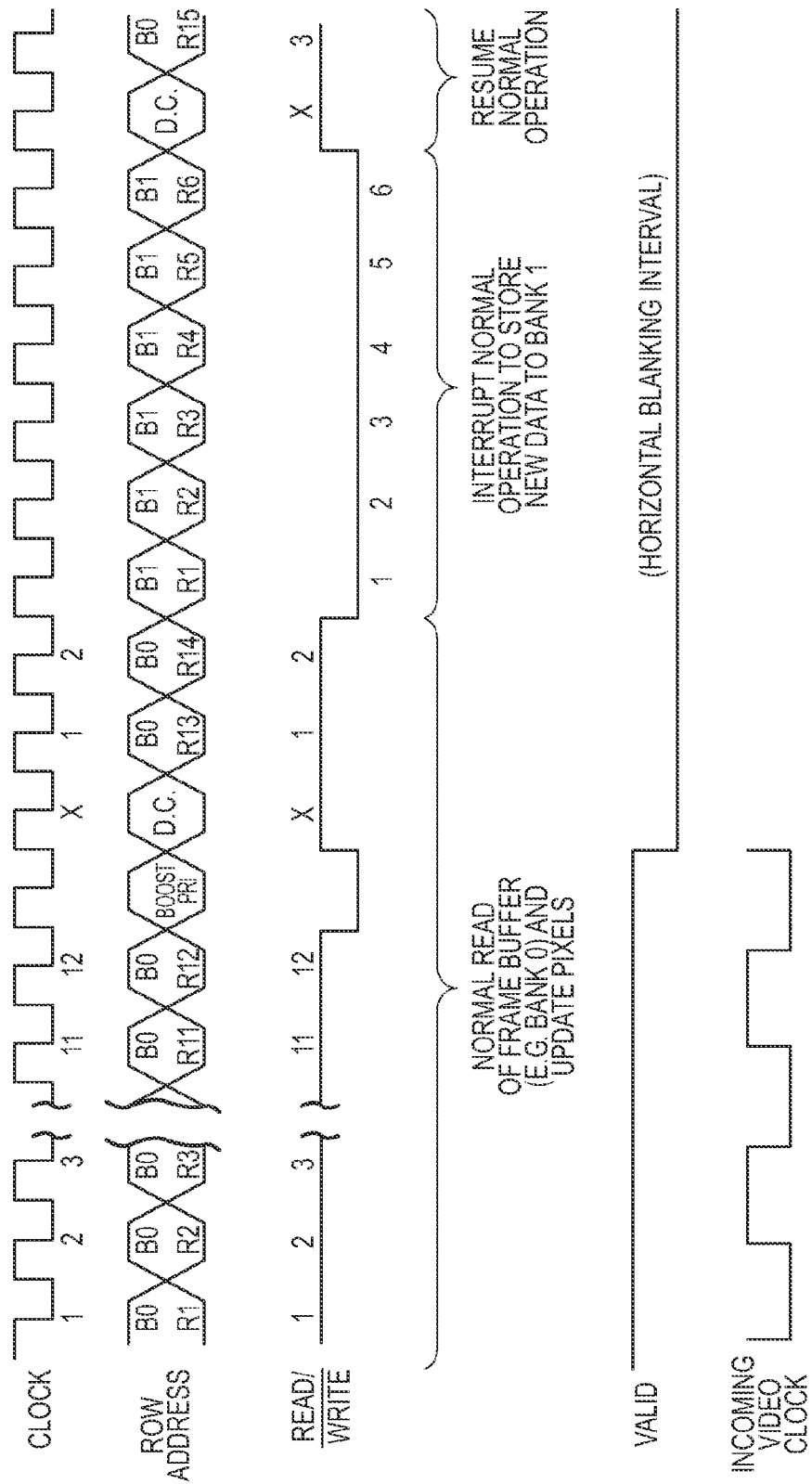
FIG. 19 is a timing diagram showing the interleaving of reading and writing operations in the present invention.

An important feature of the microdisplay disclosed here is its ability to accept and simultaneously display standard video signals. This is accomplished by the aforementioned banks of pixel line buffers 106 and 108, in conjunction with the action of column data processors 110 and 112, as is now described with respect to FIG. 19. This figure shows the timing relationship between elements of the input video signal, namely the encoded input video data and a VALID signal, and elements of the gray-scale action of the CDP and pixel line buffers, namely the display clock 118, a READ signal supplied by the control block 116 to the pixel line buffers 106 and 108 and the sense amplifiers 102 and 104, and a sequence of row addresses supplied by control block 116 to row control 122. The READ signal has one state (e.g., high) when it is desired for the sense amplifiers to be reading the data from a row of SRAM registers selected by row control 122, and the opposite state (e.g., low) when it is desired to write encoded image data to selected rows of the SRAM registers. As previously described, the SRAM array provides double buffering of the encoded image data so that while data corresponding to an incoming image may be written to one buffer, data corresponding to a previous image can be read without being corrupted from a second buffer. For the purposes of FIG. 19, row addresses in one image buffer are denoted B0Ri, where i denotes the row number, while row addresses in the other buffer are denoted B1Ri. Row addresses corresponding to pixel boost circuit registers are denoted PRi. At the time depicted at the left of FIG. 19, VALID is high indicating that valid image data is being supplied as this data is supplied it is temporarily written to the registers in pixel line buffers 106 and 108. Meanwhile, READ is high and the CDPs are processing stored encoded image data for gray-scale display on the pixel array. In the example depicted in FIG. 19, encoded image data is being read from buffer bank B0, starting with row B0R1 at the left of the figure. After twelve clocks, data has been read from rows B0R1 through B0R12, after which time the CDP has accumulated enough comparison results to write back pixel control signal 206 to registers in the boost cells. To effect this, READ goes low at this point, completing a cycle of reading frame buffer registers and updating pixels. As depicted in the figure, VALID might go low during this cycle, marking the end of a line of incoming video data. Control block 116 thus recognizes that the pixel line-buffers are full. Even though the next cycle of reading of image data from the frame buffer has already begun (reading from lines B0R13 and B0R14 in the example portrayed in this figure), the buffer-full signal causes the cycle to be interrupted, READ goes low, and the data stored in the pixel line-buffers is written to the other frame-buffer bank (to rows B1R1 through B1R6 in this example). After this writing completes, READ goes high, and the normal cycle of reading followed eventually by writing to the boost registers continues. In this way, by interleaving the reading of data from one frame buffer with occasional writing of data to the other frame buffer, the display can simultaneously accept standard video data while displaying an artifact-free image. Given that a new line of incoming video data starts every 60 ms or so, and that the horizontal blanking portion of this period occupies about 11 ms, and that the time required to empty the pixel line-buffers is equal to six display clock periods, or about 100 ns (for the 60 MHz display clock typically used by the applicant), the requirement to write incoming data occurs relatively infrequently, and can be caused to occur anywhere in a relatively wide interval, and causes only minimal perturbation of the gray scale scheme.

Image Compression/Decompression

One of the features of the present invention is that the incoming image data provided to the control unit 116 can be compressed for storage purposes in the SRAM image buffer distributed throughout the silicon backplane 70 and decompressed for eventual display by the pixels. Any of several different types of compression algorithms are available to accomplish this. One approach is to first convert RGB data from red, green, and blue values for each pixel to the conventional YUV system or a variant thereof. The YUV system includes a luminance component (Y) and two color-difference signals (U and V). In one common version, denoted $YC_BC_R$, the color difference signals store largely red ($C_R$) and blue ($C_B$) information where luminance (which also contains most of the green) has been subtracted out. The following matrix transformation generates standard $YC_BC_R$ signals from RGB signals:

$$\begin{bmatrix} Y \\ C_B \\ C_R \end{bmatrix} = \begin{bmatrix} 16 \\ 128 \\ 128 \end{bmatrix} + \frac{1}{256}\begin{bmatrix} 65.738 & 129.057 & 25.064 \\ -37.945 & -74.494 & 112.439 \\ 112.439 & -94.154 & 18.285 \end{bmatrix} \cdot \begin{bmatrix} R \\ G \\ B \end{bmatrix} \quad (1)$$

In this representation R, G, and B take on values from 0 to 255 (unsigned 8-bit numbers). Y ranges from 16 to 235, and $C_B$ and $C_R$ range from 16 to 240. In some implementations, the $YC_BC_R$ values are restricted to a subset of the 8-bit range (0-255) to permit the insertion of special codes for synchronization and to allow processing headroom in video electronics.

One can invert this transformation to restore RGB values (which are required to actually view an image, on a CRT monitor, for example):

$$\begin{bmatrix} R \\ G \\ B \end{bmatrix} = \frac{1}{256}\begin{bmatrix} 298.082 & 0 & 408.583 \\ 298.082 & -100.291 & -208.120 \\ 298.082 & 516.411 & 0 \end{bmatrix} \cdot \begin{bmatrix} Y-16 \\ C_B-128 \\ C_R-128 \end{bmatrix} \quad (2)$$

One motivation for using the YUV system rather than other similar systems is that the human visual system has different responses to different wavelengths of light. The ability to discriminate fine spatial detail, for example, is higher for images where the detail is in the luminance than it is for images where the luminance is more constant and the detail is in color variations. Spatial resolving power is also lower for blue than it is for red or green. The compression algorithm of the present invention takes advantage of this difference in spatial resolving power based on color. The algorithm converts the RGB data to a variant of the YUV system.

Figure 20:
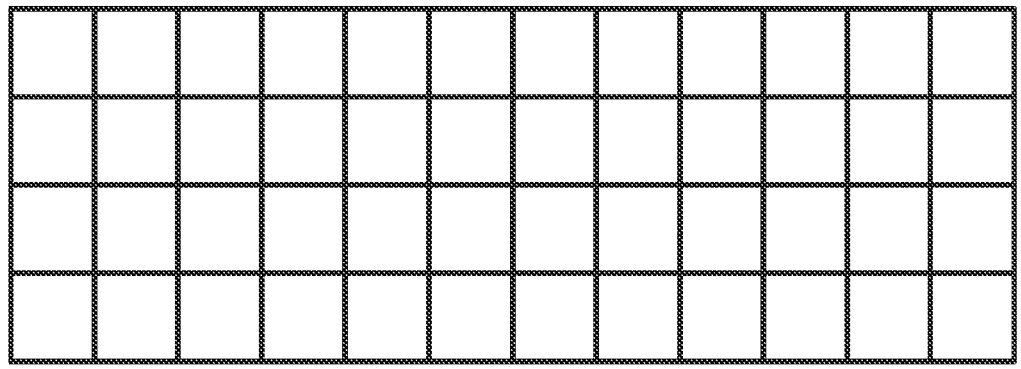
FIG. 20 is a representation of a sampling technique for image data.
Figure 21:
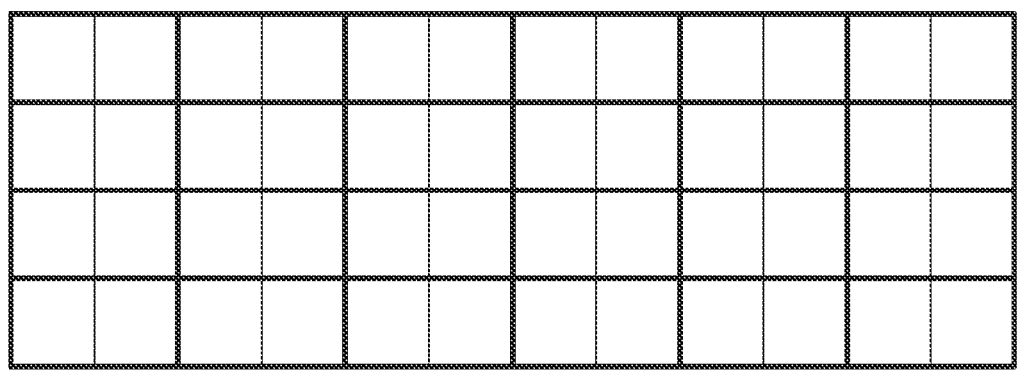
FIG. 21 is a representation of a sampling technique for compressed image data.
Figure 22:
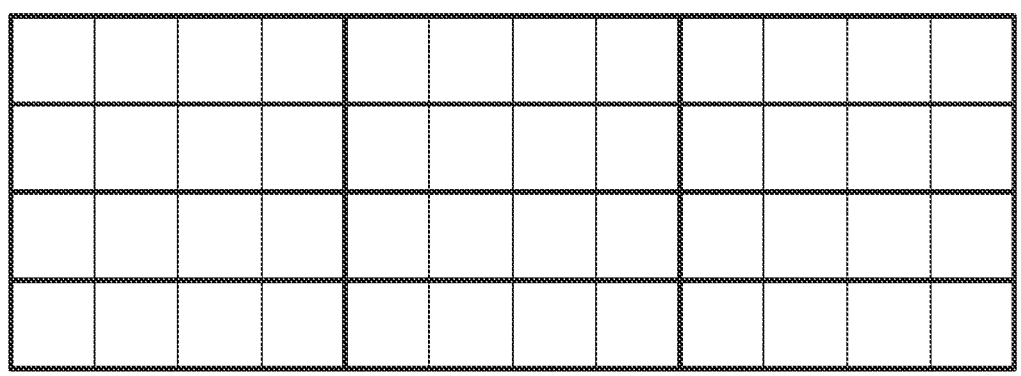
FIG. 22 is a representation of a sampling technique for compressed image data.
Figure 23:
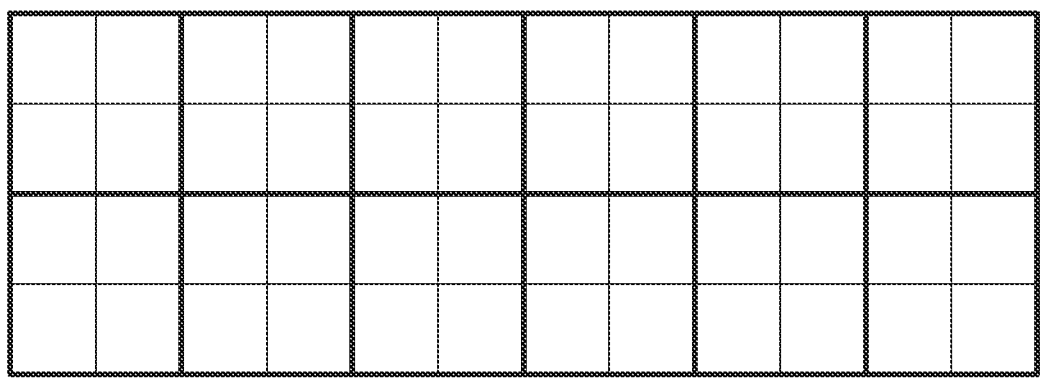
FIG. 23 is a representation of a first sampling technique of the present invention for compressed image data.

Existing standard sampling techniques are denoted by terms such as 4:4:4 (illustrated in FIG. 20), 4:2:2 (FIG. 21), and 4:1:1 (FIGS. 22 and 23). In YUV-type systems having a first component containing luminance information and the next two components containing color difference or some other type of chroma information, the three numbers in the term 4:2:2 express the rate at which each of those components is sampled. In FIGS. 20 and 21, each square represents a separate pixel with a separate luminance sample for each pixel. In FIG. 20, these squares also represent separate U and V values for each pixel. In FIG. 21, each rectangle with thick-lined borders represents two adjacent pixels that together have a single U value and a single V value. Thus, in 4:2:2 the Y component is sampled twice as often as the color difference components, and in 4:1:1, the Y component is sampled four times as often (as demonstrated by the thick-lined rectangles that each include four pixels as shown in FIGS. 22 and 23). The phrase 4:2:2 is often called "broadcast video" and is considered a fairly high quality image compression format. Modern-day consumer digital video camcorders use 4:1:1 almost exclusively. This reduced sampling normally occurs within a given horizontal line of image data. Thus, for a scan line including 720 pixels, a 4:1:1 sampling technique would imply 720 luminance (Y) samples, 180 $C_R$ samples, and 180 $C_B$ samples, as shown in FIG. 22. This is the NTSC version of 4:1:1. PAL systems typically also include vertical sub-sampling. Instead of four horizontal pixels sharing a single $C_R$ sample, for example, a 2×2 region of pixels shares a single $C_R$ sample, as shown in FIG. 23. This requires the addition of a line buffer and digital video systems to store previous scan lines, but it produces slightly more pleasing images. Thus, the PAL version of 4:1:1 is sometimes denoted as 4:2:0 to emphasize this difference in sampling geometry.

The present invention receives 24-bit RGB data (8 bits each for red, green, and blue) for each pixel and converts it to a format to be discussed further below that can be stored as an average of 12 bits per pixel. As will be seen, the pixels are grouped into 2×2 pixel groups, such as pixel group 224 and 226, so for each pixel group, 48 bits of data are stored for each image. Because of double buffering, two 48-bit rows of data are required for each pixel group.

Furthermore, in order to simplify the data processing at the encoding stage performed by the control unit 116 and at the decoding stage performed by decode blocks in the CDPs, such as decode block 200, a new variant on the YUV system, called DEF, has been created. The coordinate transformations are $$D_i = (\tfrac{1}{2})R_i + (\tfrac{1}{2})G_i$$

$$E = (-\tfrac{1}{4})R_{ave} + (-\tfrac{1}{4})G_{ave} + (\tfrac{1}{2})B_{ave}$$

$$F = (\tfrac{1}{2})R_{ave} + (-\tfrac{1}{2})G_{ave} \quad (3)$$

for the forward transformation and $$R_i = D_i + F$$

$$G_i = D_i - F$$

$$B_i = D_i + 2E \quad (4)$$

for the reverse transformation. Here the i subscript denotes values for single pixels while E and F are based on $R_{ave}$, $G_{ave}$, and $B_{ave}$ values averaged over several pixels.

D, E, and F are three letters arbitrarily selected to represent this new color-space that is a variant of the YUV system. The letters have no particular meaning other than they seek to avoid use of letters common to other color-space schemes such as RGB, YUV, $C_R$, and $C_B$. Note that the coordinate transformations can be performed with integer arithmetic rather than the floating-point arithmetic that would be required to convert between the RGB and YUV formats as shown in Equations 1 and 2 above. Since the DEF color space is intended only as an interim color-space for the purpose of storage of images internal to the microdisplay, the meaning of what D, E, and F represent is somewhat arbitrary, unlike the YUV system.

As an alternative to the sampling described above, that requires a frame buffer of effectively 12 bits per pixel, it would also be possible to sample at a 12:2:1 format to effectively require a frame buffer of 10 bits per pixel.

As will be understood, referring back to FIGS. 5 and 11, the image data provided to the control unit 116 may be 24 bit RGB data while the encoded image data 172 provided from the control unit 116 to the line buffer and column driver banks 106 and 108 is in DEF format (with 48 bits coding the image content associated with four pixels, for an average of 12 bits per pixel). The data in this DEF format is then stored in the SRAM memory cells 180 in the vertical slices and later read by the sense amplifiers 176 and provided to the decode blocks 200 of the vertical slices where the DEF data is converted back to RGB data, prior to the aforementioned comparison operations.

Figure 24:
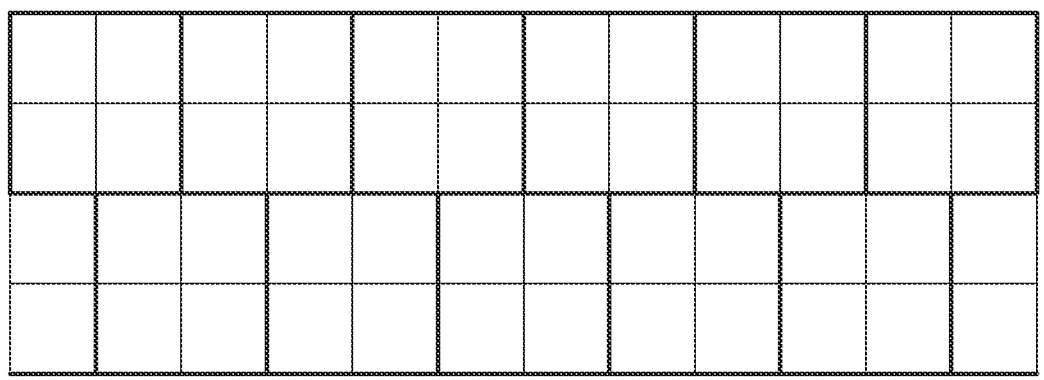
FIG. 24 is a representation of a second sampling technique of the present invention for compressed image data.
Figure 25:
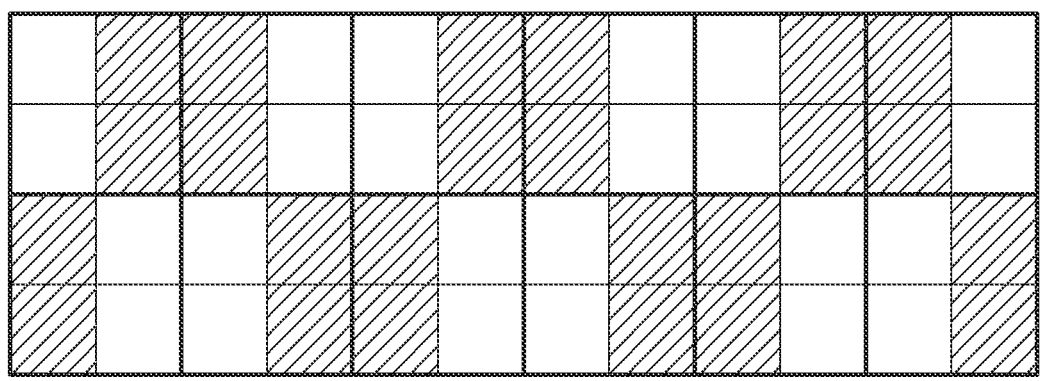
FIG. 25 is a representation of a third sampling technique of the present invention for compressed image data.
Figure 26:
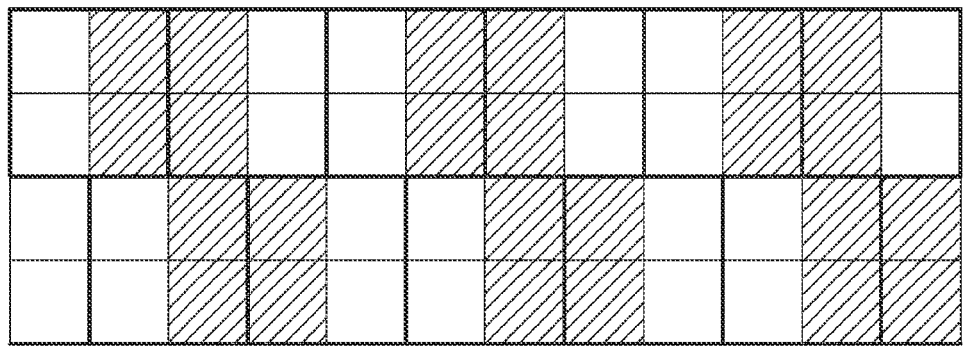
FIG. 26 is a representation of a fourth sampling technique of the present invention for compressed image data.
Figure 27:
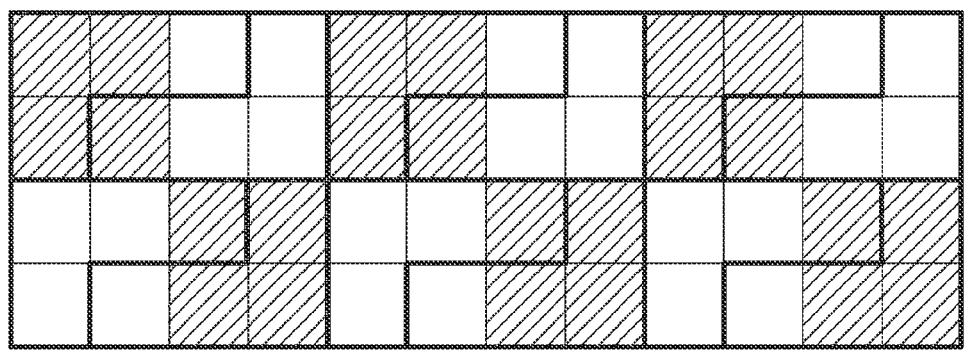
FIG. 27 is a representation of a fifth sampling technique of the present invention for compressed image data.
Figure 28:
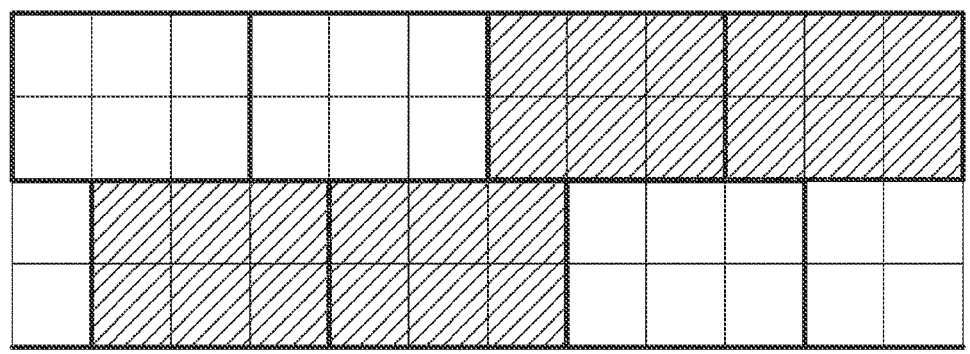
FIG. 28 is a representation of a sixth sampling technique of the present invention for compressed image data.

There are many alternatives to the type of sampling that could be utilized in the present invention. This may also include many variants to the 4:1:1-equivalent coding, such as one in which each of the 2×2 pixel groups is aligned with the 2×2 pixel group therebeneath (FIG. 23), or the 2×2 pixel group in the next adjacent pair of rows to the first 2×2 pixel group could be offset horizontally by one pixel (FIG. 24) so that the 2×2 pixel groups are not vertically aligned. Another variant (shown in FIG. 25) would be to define different 2×2 pixel groups for one of the chroma components (e.g., the E or the F component) (signified by the thick-lined borders) and define a different 2×2 pixel group for the other of the two chroma components (signified by the absence or presence of cross-hatching). In other words, the pixel group for the E component would share only two pixels with a pixel group for the F component. Otherwise, the E component pixel groups would be aligned with each other vertically and the F component pixel groups could be aligned with each other vertically. As a further variation on this variation, there could be an offset by one pixel horizontally in every other pair of adjacent rows (FIG. 26) so that the E component pixel groups were not aligned vertically, nor are the F component pixel groups aligned vertically. Another variation would be to define a four-pixel group that is not a 2×2 array (FIG. 27). For example, a pixel group could consist of three pixels on one row and one pixel in an adjacent row, to achieve an L shape. The next adjacent pixel group could have three pixels on the adjacent row and one pixel on the original row to also achieve an L shape and make the two L shapes mate together into a combination of the pixel groups which is two pixels high and four pixels wide. This arrangement could be done for both of the chroma components, or only one with the other chroma components having the original 2×2 configuration, for example. As can be seen, there are nearly endless variations of chroma combinations. There are several methods to these variations, one is to stagger the starting positions of the color difference samples in the vertical direction. This is intended to address the appearance of vertical striping that can occur in the image if there is too much vertical correlation of samples in the compression technique. Another method is to displace the two chroma samples relative to each other. Yet another method is to vary the type of sampling geometries. Also, since the human visual system is relatively less sensitive to blue light, the E component that has the blue light as a sub-component could be sampled at an even lower rate that the F component. One approach would be a 12:2:1 sampling technique that would require an average 10 bits per pixel. In this case (shown in FIG. 28), every pixel would have its own D value, while a 3×2 pixel group would share an F value and a 6×2 pixel group would share an E value.

Thus, it can be understood that since each row of SRAM within a particular vertical slice contains 48 bits of data, which represents the encoded luminance and chroma information (in the defined DEF format) for a 2×2 pixel array or pixel group, and that it is desired to write an entire row or rows of pixels at the same time (actually it is desired to write to one row of boost circuits which corresponds to four rows of pixels), there needs to be 12 different reads, each of a different 48-bit row to get all the information needed to decode, compare, and write the desired state to four of the rows of pixels. As the comparisons are performed, their results are gradually stored in a 48-bit register. After this register is full (of 48 comparison results), the accumulated values are used to enable (in the case that the result of a particular comparison was equality) or not enable (in the case that the result of a different particular comparison was inequality) the writing of a change to the boost circuit register in a single write operation.

A power-saving feature of the microdisplay 44 is that the data in the register acts as a write enable to the boost circuits and thus only causes a change to the bit lines in one of the 0 or 1 conditions. Because of this, the number of times that the bit lines need to be charged/discharged is reduced.

Figure 13:
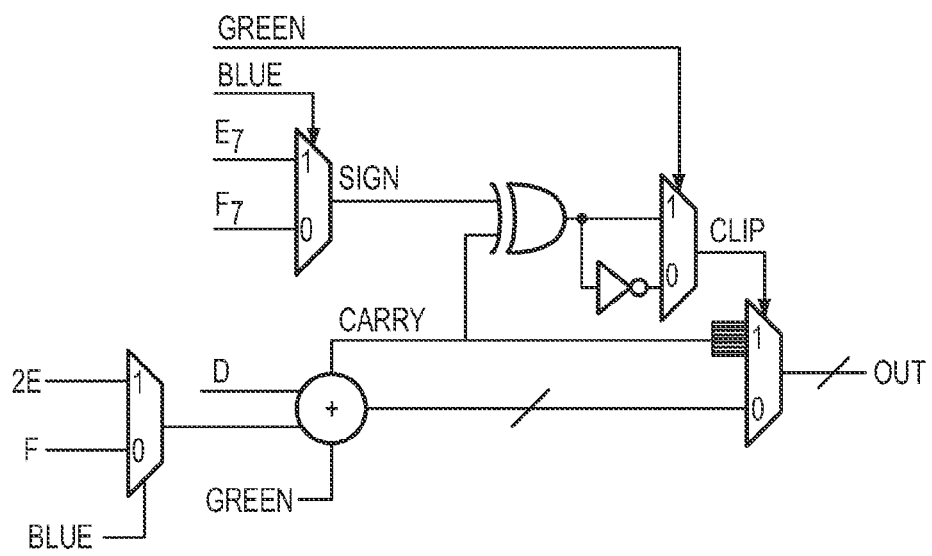
FIG. 13 is a logic diagram of a circuit of the present invention that is utilized in transforming between coordinate systems while decoding from DEF to RGB color-space.

Since E and F are signed numbers between −127 and 128 and D is an unsigned number between 0 and 255, it is possible to have valid DEF values that transform (via Equation 4) to invalid RGB values (e.g., R, G, or B has a value less than 0 or greater than 255). Performing clipping in the traditional manner by comparing the transformed values to 0 and 255 and taking action if they exceed the acceptable range is possible, but it is likely to consume too much silicon real estate. FIG. 13 shows a simplified clipping circuit that is included as part of each decode block 200 to prevent the generation of any values outside of the range of 0 to 255 by the DEF to RGB conversion. As can be seen from Equation 4, the DEF to RGB conversion requires as inputs $D_i$, 2E, and F. A decode signal 202 is provided in, for example, on two lines called GREEN and BLUE. When the CDP is providing green decoded image data to the comparator, GREEN is active and BLUE is inactive. When the CDP is providing blue decoded image data, BLUE is active and GREEN is inactive. When the CDP is providing red decoded image data, both GREEN and BLUE are inactive. GREEN and BLUE both being simultaneously active is avoided. A first multiplexer selects between 2E and F depending on the state of BLUE, with the multiplexer output being provided as a first input to a summer. The signal D is provided as the other input to the summer, which also accepts the signal GREEN at its carry input. The output of the summer is provided to a second multiplexer. A carry output of the summer is provided as an input to an exclusive OR gate. The other input to the exclusive OR gate is provided from a third multiplexer that receives the sign bits from E and F (the MSB of each). The third multiplexer is controlled by the BLUE decode signal so that when blue is to be decoded, the sign bit of E is used and otherwise, the sign bit of F is used. Thus, the selected sign bit and the carry bit from the summer are inputs to the exclusive OR gate and the output will be a logical 1 if the inputs are different and a logical 0 if the inputs are the same. This output and its inverse are provided as the two inputs to a fourth multiplexer. The fourth multiplexer is controlled by the GREEN decode signal so that when green is to be decoded, the inverted output of the exclusive OR is used and otherwise the inverted output of the exclusive OR is used. If the output of the fourth multiplexer is a logical 0, it means no clipping is necessary and the 8-bit output of the summer is used. If the output is a logical 1, however, it means clipping is necessary and instead of the output of the summer, the carry bit is selected (expanded to 8 bits of the same value of the carry bit, of course). Thus, either a 255 (binary 11111111) or a 0 (binary 00000000) is provided.

One aspect of the present invention is the logical separation of data storage in the distributed frame buffer from the storage register to control the display of the pixel. These two storage locations are logically separated while a common physical access mechanism (the CDP, the sense amps, column drivers, and row control unit) functionally interrelates the two storage areas.

Gray-scale Modes

The microdisplay of the present invention may provide 120 full color images per second, which means 120 red images, 120 green images, and 120 blue images due to its field sequential color nature. This essentially means that it displays 360 images per second, which means a new image or at least a new color field every $1/360^{th}$ of a second, or 2.78 milliseconds. During each of these 2.78 millisecond intervals, encoded data is read from the SRAM memory cells, decoded, and compared 255 times to the ramp signal 114. Each of these $1/360^{th}$ slices of a second is thus divided into 255 time slots of the ramp signal 114. This means there are at least 360×255 time slots per second. Thus each time slot is, at most, 10.9 microseconds long. During each of these time slots, new data may be written to the storage register of each pixel to change its state in this digital pulse width modulation approach.

While a 3×(3 times the input field frequency) mode displaying 8 bits of each of three colors with 512 data comparisons per color (256 to be displayed and 256 for DC-balance) has been described, the microdisplay 44 also allows for several other display modes. One is a 6× mode displaying 7 bits of each of three colors. This mode has 512 data comparisons per color per field. Another is a 6×8-bit Split MSBs 7-4 mode. By displaying only 6 bits in each of the two display ramps, this mode delivers 8-bit gray scale resolution in a display field with the lowest power algorithm available. The first algorithm cycle has 32 data comparisons, the second algorithm cycle has 64 data comparisons, for a total of 192 data comparisons per color per field. Another is a 6×8-bit Add LSB mode. This mode runs in 7-bit mode during the first algorithm cycle and 8 bits during the second algorithm cycle. Color values with the LSB on switch one cycle later than with the LSB off. This produces a waveform where the LSB is added to the second 7-bit ramp. This mode has 512 data comparisons per color per field.

SRAM

Figure 14:
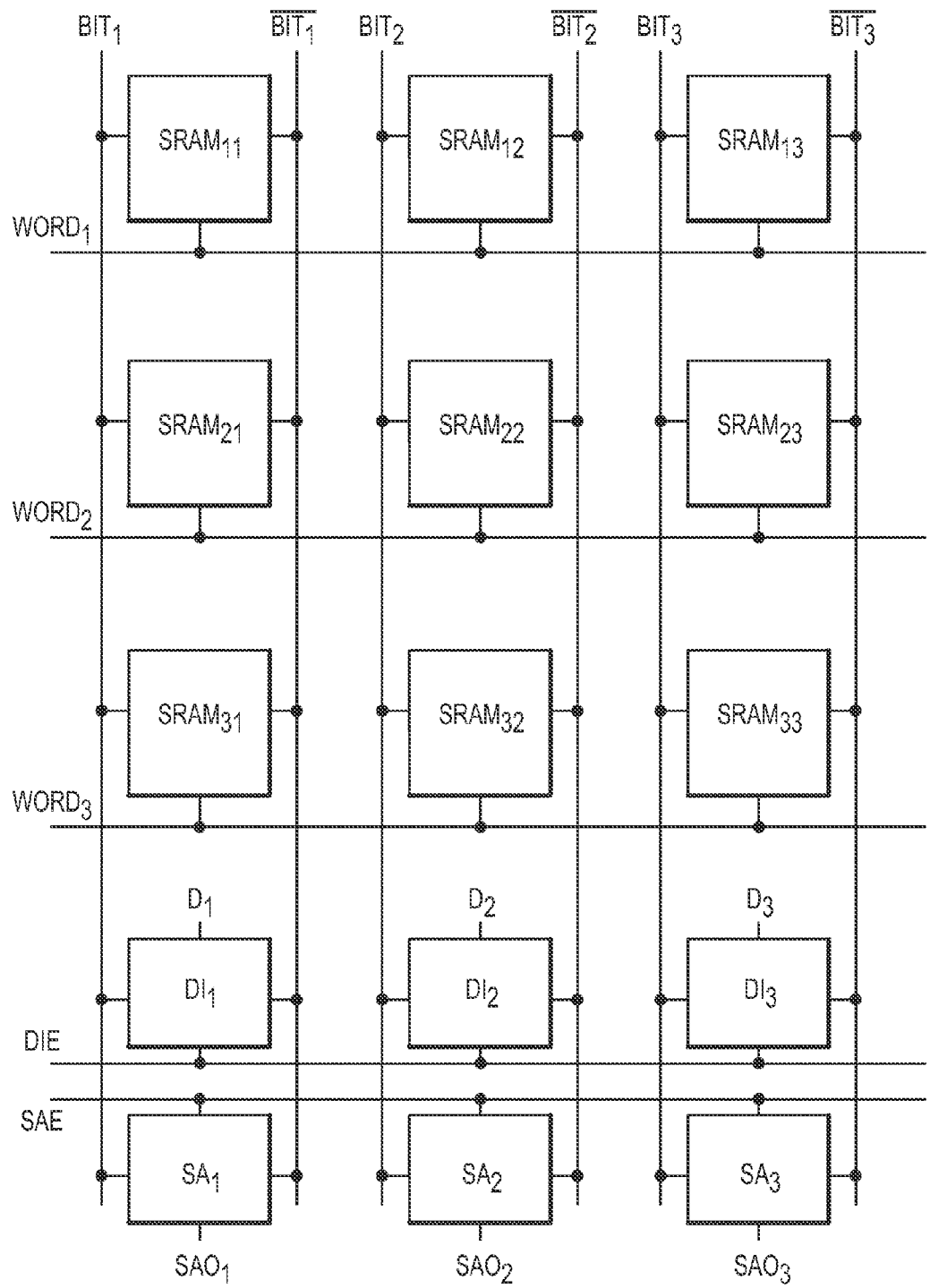
FIG. 14 is a simplified representation of a portion of the SRAM memory array and its connection to data-in circuits and sense amplifier circuits.

FIG. 14 shows a portion of the array of SRAM memory cells in the layer 130 of the silicon backplane 30. For ease of illustration, only nine of the SRAM memory cells are shown in three rows, each having three cells that are arranged in columns with the corresponding cells in the adjacent rows. The SRAM memory cells in FIG. 14 are labeled $SRAM_{XY}$ with X being the row number and Y being the column number for the SRAM memory cell. Each column of SRAM memory cells has a pair of BIT lines associated therewith, $BIT_Y$ and $\overline{BIT}_Y$, where Y is the column number for the BIT lines. Each row of SRAM memory cells has a word line, $Word_X$, where X is the row number for the word line. Associated with each column of SRAM memory cells is a single "data-in" circuit designated as $DI_Y$, where Y is the column number and a sense amplifier circuit designated as $SA_Y$, where Y is the column number. The row of data-in circuits $DI_Y$ each receives a data-in enable signal (DIE) that serves to enable the entire row of data-in circuits. Each sense amplifier circuit ($SA_Y$) receives an amplifier enable signal (SAE) that enables the entire row of sense amplifiers. The data-in $DA_Y$ and sense amplifier $SA_Y$ are also connected to the $BIT_Y$ and $\overline{BIT}_Y$ lines as this is how data is written to and read from the SRAM memory cells. Each data-in circuit $DI_Y$ receives a separate data signal $D_Y$ indicating the data to be written to the selected SRAM memory cell. Each sense amplifier circuit $SA_Y$ provides a sense amplifier output signal $SAO_Y$ indicative of the value read from the selected SRAM memory cell.

For example, although data could be written to or read from any individual SRAM memory cell without regard to other SRAM memory cells in that same particular row, it is most typical to write data to an entire row of SRAM memory cells at the same time and to read data from an entire row of SRAM memory cells at the same time. If it were desired to write data to the second row shown in FIG. 14, then data $D_Y$ would be provided to each of the $DI_Y$ circuits and the data-in enable DIE signal would be set to a logical 1. The $Word_2$ line would also be set to a logical 1 so that the data $D_Y$ can be put on the $BIT_Y$ and $\overline{BIT}_Y$ lines by the data-in circuits $DI_Y$. The second row of SRAM memory cells being enable by the $Word_2$ line being at a logical 1, will access the $BIT_Y$ and $\overline{BIT}_Y$ lines and store the value therewithin, as will be described further below. The $Word_2$ and DIE signals can then be returned to a logical 0. When it is desired to read data from the second row of SRAM memory cells, the $Word_2$ line is set to a logical 1 and the second row of SRAM memory cells $SRAM_{2Y}$ provides information on the $BIT_Y$ and $\overline{BIT}_Y$ lines to be read by the sense amplifier circuits $SA_Y$. Once the sense amplifier enable signal SAE is set to a logical 1, the sense amplifier circuits $SA_Y$ become activated, read the information on the $BIT_Y$ and $\overline{BIT}_Y$ lines and provide an output signal at the $SAO_Y$ lines.

Low-Power Features

It is important in many microdisplay applications to minimize power consumed by the microdisplay. The presently disclosed microdisplay incorporates a number a features to minimize the contribution of SRAM operation to overall microdisplay power consumption, which contribution would otherwise be impractically large. It is known in the memory art to seek to minimize the power drawn by SRAM by using current-mode operation, as is demonstrated by Khellah, "A Low-Power High-Performance Current-Mode Multiport SRAM" IEEE Transactions On VLSI Systems, Vol. 9, No. 5, pp. 590-98 (October 2001) and Blalock and Jaeger, "A High-Speed Clamped Bit-Line Current-Mode Sense Amplifier" IEEE Journal of Solid-State Circuits, Vol. 26, No. 4 (April 1991), the contents of which are incorporated herein by reference. In current-mode operation, both $BIT_Y$ and $\overline{BIT}_Y$ lines are held at a nearly unchanging voltage level, and differential current injected (during writing) or detected (during reading) into the lines is used to operate the memory. By keeping the voltage swing V of the bit lines small, $CV^2$ power dissipation caused by charging and discharging the capacitance C of the bit lines is kept small. In the architecture of the present microdisplay, many read operations occur for each write operation, so the power consumption during reading is substantially more important for overall display power consumption. The applicants attempted to apply current-mode teaching during the design of the present microdisplay, but found that current-mode sense amplifiers known in the art were not well suited to use in applicant's microdisplay. Prior-art current-mode sense amplifiers were difficult to lay out on the tight pitch required by the microdisplay SRAM column spacing. Further, the bias current required for adequate sense-amplifier sensitivity resulted in large sense-amplifier power dissipation for the SRAM array of applicant's microdisplay. Thus, the use of current-mode operation defeated its low-power purpose in this application.

Figure 29A:
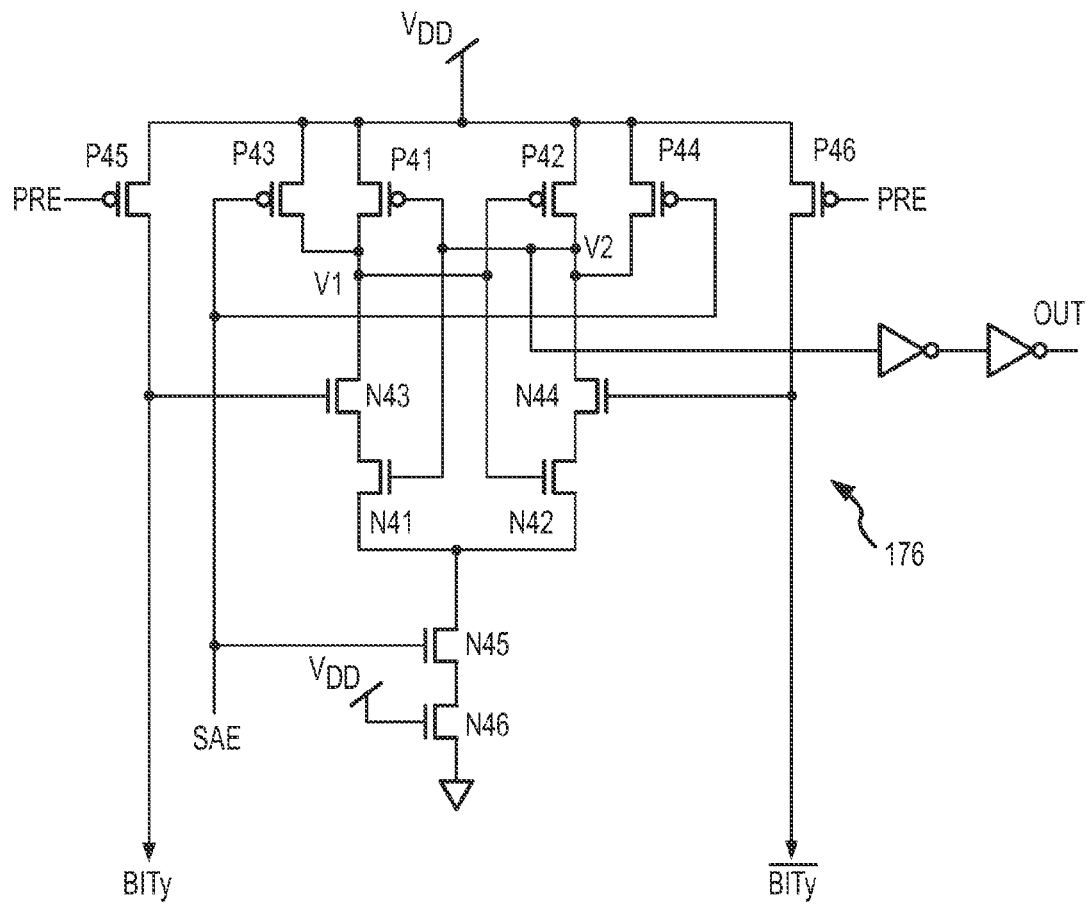
FIGS. 29a and 29b are a schematic and a timing diagram, respectively, for a sense amplifier for an SRAM circuit of the present invention.
Figure 29B:
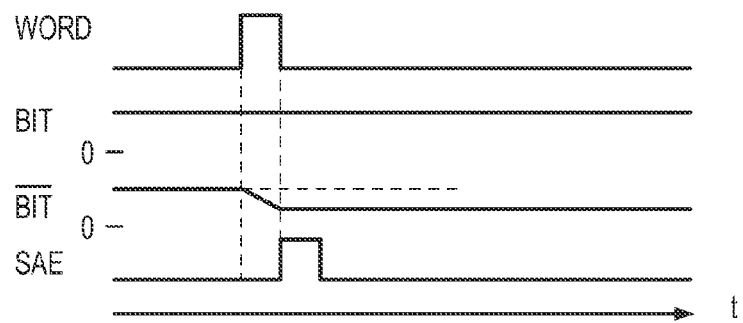

Novel low-power design and operation of the SRAM array of the present microdisplay are illustrated in FIGS. 29*a* and 29*b*. FIG. 29*a* shows the circuit schematic for the sense amplifier 176. Sense amplifier 176 acts as a precision voltage comparator. SRAM bit lines $BIT_Y$ and $\overline{BIT}_Y$ are connected the sense amplifier inputs at the gates of transistors N43 and N44. The amplifier operates as follows with reference also to FIG. 29*b*. Prior to a read, the sense amplifier enable signal SAE is held low, blocking any current flow in the amplifier, while pulling internal nodes V1 and V2 high to $V_{DD}$. The bit lines are also pulled high to $V_{DD}$ by the action of P45 and P46 under the control of signal PRE. Prior to the SRAM read, PRE goes high, letting the bit lines go open-circuit. Next the Word line is pulsed high to connect the SRAM register in the selected row to the bit lines. One side of the SRAM cell is already high, but the other side will begin pulling one of the bit lines low ( $\overline{BIT}_Y$ in the example shown here). The Word line pulse is kept short to limit the voltage swing of the bit line. In typical operation, the width of the Word line pulse might be 4 ns, during which the bit line comes down on the order of 200 mV. Next the sense amplifier is enabled by signal SAE going high. This releases the internal nodes V1 and V2, and also causes current to flow through N45 and N46. Given that a small differential voltage (on the order of 200 mV in this example) appears between the gates of N43 and N44, one of the V1 and V2 internal nodes will fall faster than the other. Feedback generated by the cross coupling of V1 to the gates of N42 and P42 and of V2 to the gates of N41 and P41 will cause the sense amplifier to rapidly latch into a state determined by the small voltage difference between the bit lines. The output of the sense amplifier the reveals the state originally stored in the selected SRAM register.

The key features of sense amplifier 176 are that it operates in voltage mode with very little power consumption, and that it is amenable to a very compact layout. Power consumption during reading of the SRAM array is minimized by the short pulsed action of the Word lines which serves to minimize the developed voltage swing on the bit lines, thereby keeping $CV^2$ power dissipation low. By limiting the bit-line swing to 200 mV $CV^2$ power dissipation is reduced by a factor of 150 compared to a conventional SRAM operating in a mode where the bit lines swung all the way to the $V_{DD}$=2.5 V rails typical for a 0.25 μm CMOS process.

Other techniques are used in the SRAM array of the present microdisplay in order to further reduce power consumption. Cutting the array in half along the dividing line 100 helps to save power and clock distribution. Limiting the number of write cycles saves on power.

Pixel Boost Circuits

Figure 15A:
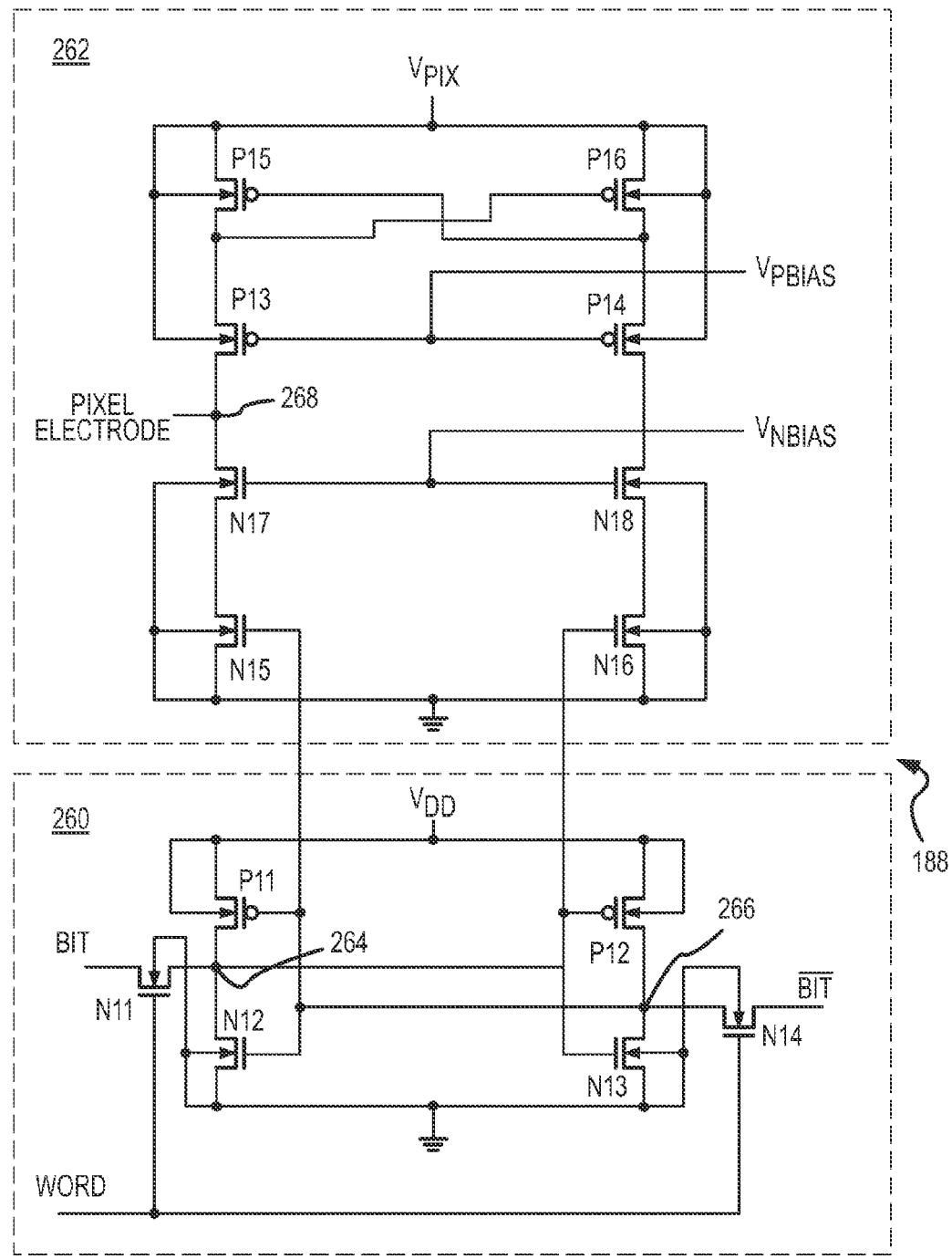
FIGS. 15a, 15b, and 15c are schematic diagrams of boost circuits for an associated SRAM memory cell that is associated with each pixel of the microdisplay of the present invention.
Figure 15B:
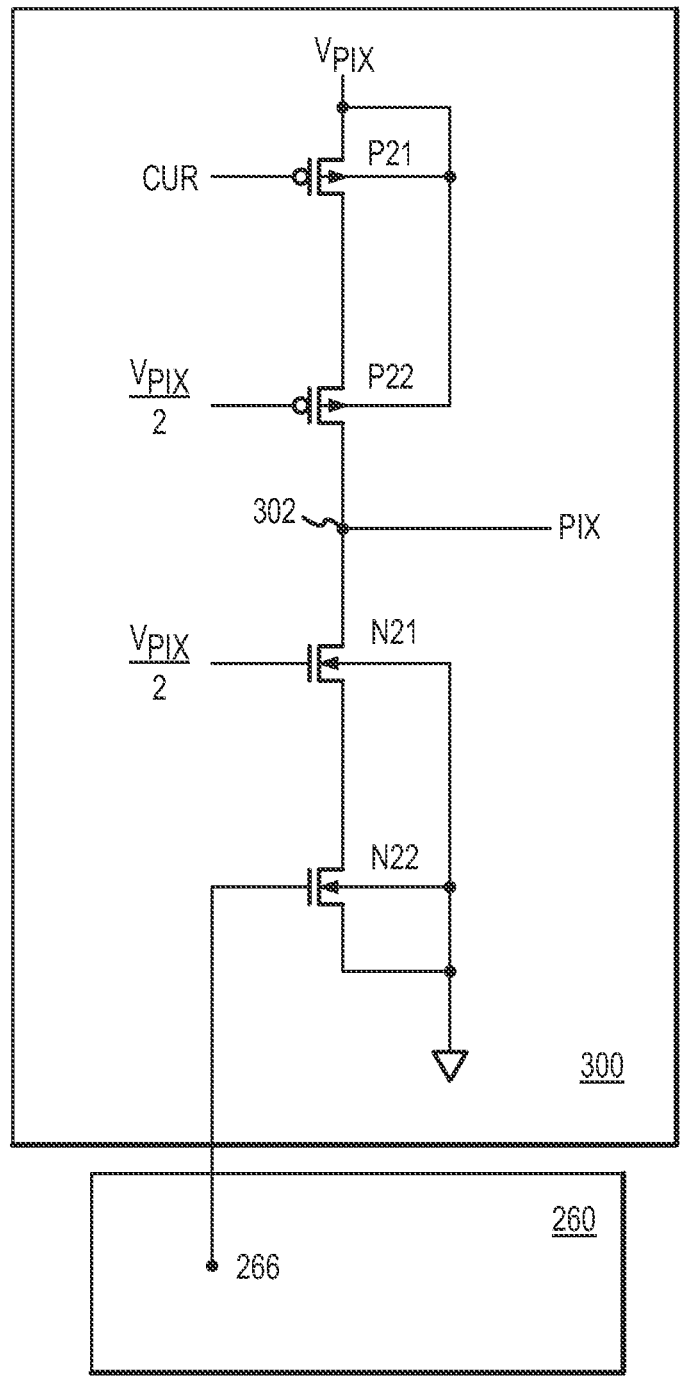
Figure 15C:
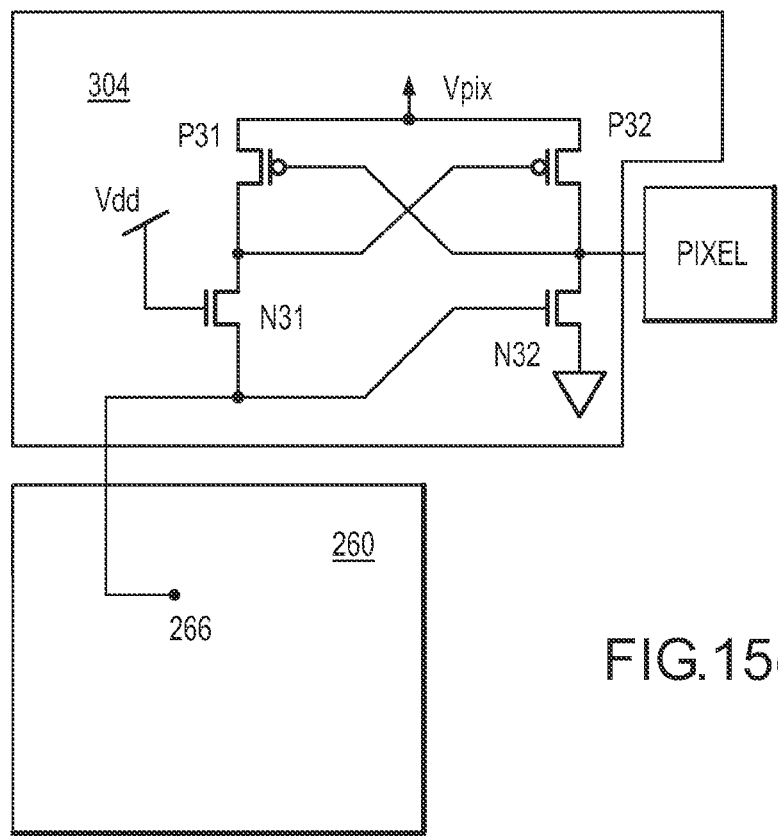

More detail about the boost circuits 188 is provided in FIGS. 15a, 15b, and 15c. The boost circuits can be constructed from standard-logic low-voltage transistors in cascode arrangements, as shown in FIGS. 15a and 15b, or by using higher-voltage I/O transistors, and shown in FIG. 15c.

Cascode Boost Circuits

The boost-circuit embodiment shown in FIG. 15a includes a storage register portion 260 and a boost portion 262. Each of the transistors in the boost circuit is an enhancement-mode device. It includes a pair of N-channel access devices N11 and N14, which are controlled by a word line. When turned on by the word line being at a logical 1, these access devices N11 and N14 allow the remainder of the storage register 260 to be connected to the BIT and $\overline{BIT}$ lines, respectively. The remainder of the storage register 260 includes a pair of inverters, one inverter including P11 and N12, and the second inverter including P12 and N13. When the word line is moved to logical 1, the voltage of the BIT line is imposed on a node 264, located between N12 and P11. Similarly, N14 is turned on and the voltage on the $\overline{BIT}$ line is imposed on a node 266 between N13 and P12. Since each of these nodes 264 and 266 are connected to the gate terminals of the opposite inverter, this condition is maintained even after access devices N11 and N14 are turned off. The source terminals of P11 and P12 are connected to $V_{DD}$. Each of N11, N12, N13, and N14 have their P-wells, the silicon substrate, connected to ground, while P11 and P12 have their N-wells connected to $V_{DD}$.

The gate terminals of N12 and P11 are also connected to the gate terminal of N15 in the boost portion 262. The gate terminals of N13 and P12 are also connected to the gate terminal of N16 in the boost portion 262. Thus, N15 will be turned off and N16 will be turned on. The source terminals of N15 and N16 are connected to ground. The drain terminals of N15 and N16 are connected to the source terminals of N17 and N18, respectively. The gate terminals of N17 and N18 are connected to a fixed bias signal VNBIAS at a voltage of 2.5 volts. The drain terminals of N17 and N18 are connected to the drain terminals of P13 and P14, respectively. The gate terminals of P13 and P14 are connected to variable voltage bias signal VPBIAS. A node 268 between the drain terminal of P13 and the drain terminal of N17 is connected to the pixel electrode for that particular boost circuit. The source terminals of P13 and P14 are respectively connected to the drain terminals of P15 and P16, respectively. The source terminals of P15 and P16 are connected together and to a separate voltage supply, $V_{PIX}$. The gate terminal of P16 is connected to the drain terminal of P15, while the gate terminal of P15 is connected to the drain terminal of P16. Each of N15, N16, N17, and N18 have their P-wells, the silicon substrate, connected to ground, while P13, P14, P15, and P16 have their N-wells connected to $V_{PIX}$.

In this example, gate N15 is turned off and gate N16 is turned on, and it is assumed that $V_{DD}$ is at a value of 2.5 volts and $V_{PIX}$ is at a value of 4 volts. VPBIAS is variable and controllable to be approximately 2.5 volts less than $V_{PIX}$, with a minimum of approximately 0.5 volts. VNBIAS is fixed to have a voltage of approximately 2.5 volts above ground. The VNBIAS causes N17 and N18 to continuously conduct while VPBIAS causes P13 and P14 to also continuously conduct. Since N16 is on, the voltage on the drain-source connection of N16 and N18 and the drain-drain connection of N18 and P14 is approximately zero volts. Since the gate of P14 is at a voltage of $V_{PIX}$ minus 2.5V, the device stops conducting when its source voltage is less than a threshold voltage of approximately 0.45V above the gate voltage. Thus, the source voltage of P14 for this instance will be (4V−2.5V)+0.45V or 1.95 above its drain voltage of approximately zero volts. Since the source of P14 is connected to the gate of P15, P15 will be conducting since its source-gate voltage of 2.05V is well above the required threshold voltage of 0.45V. Since P15 is conducting, its drain and the gate of P16 will be at approximately 4V, which will turn P16 off. Since P13 is conducting because its gate is at VPBIAS, the drain of P13 will be at the $V_{PIX}$ voltage of 4 volts. In this manner, when P15 is on and voltage of approximately $V_{PIX}$ is imposed on the drain terminal of P13, the variable VPBIAS gate voltage will assure that the voltage between the gate and source terminals of P13 is at 2.5 volts, while the source-drain voltage is approximately 0 volts and under no circumstances is greater than 2.5 volts. This prevents high source-gate voltages from overstressing and damaging P13 by hot carriers or oxide breakdown. When P13 is on in this manner, then the voltage at the node 268 connected to the pixel electrode is approximately equal to $V_{PIX}$. At the same time, N17 with its gate biased at 2.5V stops conducting as its source approaches one threshold voltage below its gate voltage 2.5V−0.45=2.05V. In this manner, high voltage damage to N17 is prevented because the source-gate voltage of 2.05V and the source-drain voltage of 1.95V are well tolerated by the 2.5V device. Higher pixel voltages may be controlled in a like manner by interposing isolated well N-channel and P-channel devices with corresponding carefully controlled bias voltages to limit the maximum voltages across all source-gate and source-drain device terminals. It can be appreciated that $V_{PIX}$ can be varied from a voltage at a minimum of between 1.1 and 1.2 volts and a maximum of 5 volts in this embodiment, to compensate for various effects such as temperature and other environmental conditions. As $V_{PIX}$ is varied for these reasons of compensation, VPBIAS is also varied so that none of the gates in the boost circuit 188 are overstressed.

An alternative cascode embodiment is shown in FIG. 15b. As in the circuit shown in FIG. 15a, it includes a storage register portion 260 similar to SRAM memory cell 234, and a boost portion 300. In the embodiment of FIG. 15b, boost portion 300 comprises only four transistors, P21, P22, N21 and N22. The gate of N22 is connected to the gate of transistor N12 (node 266) in storage register portion 260, which node is at 0 V or at $V_{DD}$ depending on whether a 0 or a 1 is stored in the register. The gate of N21 and P22 are both connected to a bias voltage VPBIAS which is now set at $V_{PIX}/2$. The gate of P21 is connected to a separate bias voltage CUR chosen to cause P21 to act as a current source, sourcing a small current, for example 8 nA, towards P22. The pixel electrode is connected to the node 302 between P22 and N21. When the gate of N22 is low, N22 is turned off, and no current flows through N21 or N22, VPBIAS keeps P22 turned on, and the small current quickly charges node 302 and the pixel electrode to $V_{PIX}$. When the gate of N22 is high, N22 is turned on, allowing current to flow to ground. VPBIAS at the gate of N21 keeps it turned on, too, allowing node 302 and the pixel electrode to be discharged to ground. The small current flows continuously in this state.

High-Voltage-Transistor Boost Circuits

As an alternative to the cascode boost circuit described above with respect to FIGS. 15a and 15b, boost circuits can be implemented with transistors, as are available in many low-voltage CMOS processes, which are designed to operate at the higher voltage levels frequently required for I/O, the transistors usually utilizing a thicker gate oxide than the core logic transistors. Such a boost circuit is shown in FIG. 15c. It again includes a storage register portion 260 and a boost portion 304. In the embodiment of FIG. 15c, boost portion 304 is made up of four transistors, N31, N32, P31, and P32, each designed to stand off the entire voltage $V_{PIX}$. Transistors useful for this purpose include transistors provided in many low-voltage CMOS processes to perform I/O functions which require voltages higher than the core logic $V_{DD}$ value. Such transistors are typically fabricated using a gate oxide thicker than that provided for the core-logic transistors. The boost portion of the circuit is again driven by node 266 internal to the register portion 260, which node 266 has voltages 0 or $V_{DD}$ depending on the value of the bit stored in the register. When node 266 is low, N31 is turned on by $V_{DD}$ applied to its gate, and the node between N31 and P31 is pulled low, turning P32 on, and pulling the pixel electrode high to $V_{PIX}$. When node 266 is high, N31 is turned off, but N32 is turned on, pulling the pixel electrode low to ground, while turning P32 off.

Temperature Sensors

Figure 16:
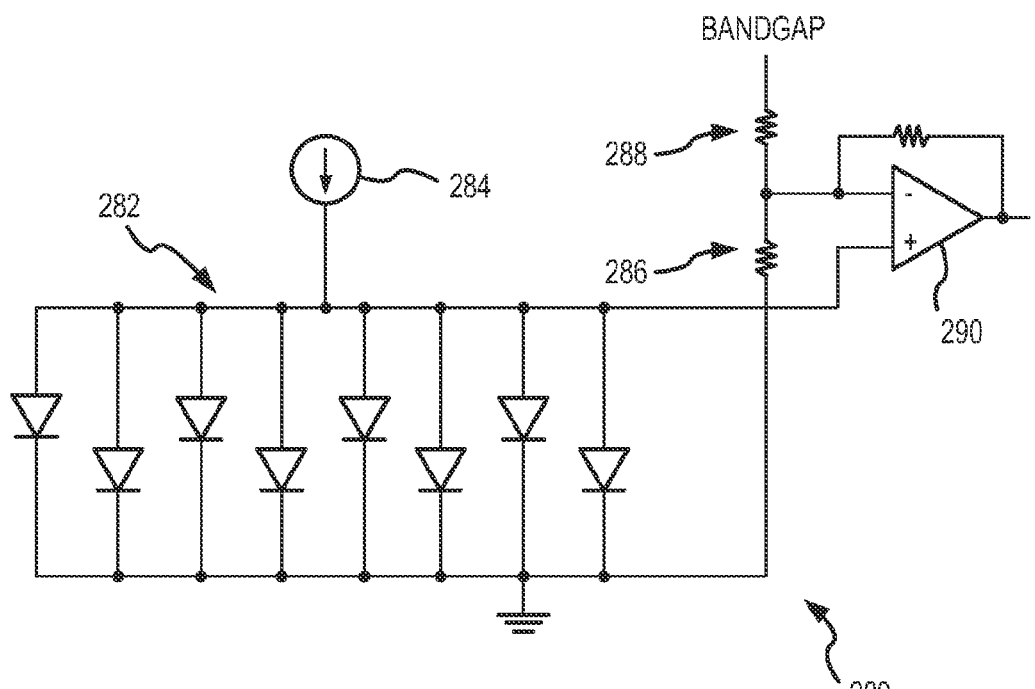
FIG. 16 is a schematic diagram of a circuit used to regulate the voltage supplied by a voltage supply of the present invention as well as to generate a voltage signal representative of the operating temperature of the microdisplay of the present invention.

The microdisplay 44 of the present invention also includes a temperature compensation scheme that can be used to compensate for variations in performance of the microdisplay 44 and the effect on the images produced thereby as a result of operating temperature. For example, the response of the liquid crystal material used in a microdisplay may differ depending on the operating temperature of the liquid crystal material. In this case, it may be desirable to use a different drive voltage for the liquid crystal material to compensate for the different switching speed of the liquid crystal material based on temperature. By selecting a different drive voltage, it may be possible to make the liquid crystal switching speed independent of temperature variation. As has been described above, it is possible to select different drive voltages for the pixel electrodes. A circuit 280 for sensing temperature variations in the microdisplay 44 is shown in FIG. 16. Specifically, the circuit 280 may be located within or not within the silicon backplane 70. The circuit 280 may be a variation on a conventional bandgap reference circuit. Bandgap reference circuits are intended to provide a voltage that to a first order is temperature and supply independent. In this case, the circuit 280 includes a group 282 of eight diodes in parallel being driven by a constant current source 284. The voltage developed by the current from the constant current source 284 across the group 282 of diodes is provided as an input to a positive terminal of an amplifier 290. A voltage is also developed by the bandgap voltage across a voltage divider including resistors 286 and 288. The voltage across resistor 286 is provided as an input to the negative terminal of the amplifier 290. A feedback resistor 292 determines the gain of the amplifier 290. The voltage across the group 282 of diodes will vary from approximately 0.7 volts to 0.4 volts as the temperature varies from −20 to 100 degrees C. The output from the amplifier 290 will vary from 1.6 volts to 0.0 volts over the same temperature range. The amplifier 290 and conventional downstream circuitry not illustrated here are used to quantify this variation in voltage and control the power supply to provide a desired voltage supply ($V_{PIX}$) therefrom. The voltage is proportional to the operating temperature of the silicon backplane, and can be used for temperature compensation. This voltage is supplied to control unit 116 that digitizes the temperature sensor voltage and compares the averaged temperature value with stored set points. When the temperature reaches a stored set point, the $V_{PIX}$ voltage is gradually adjusted over many frames to a voltage value stored is association with the temperature set point. The timing of the signals applied to the pixel electrodes may be varied as well. It is also possible to compensate for other environmental conditions by sensing them and varying the voltage or timing of drive signals or illumination.

Display Operation

The various features of the microdisplay described above yield superior displayed image quality over wide operating temperature ranges with reduced power consumption, as described below.

Sequential Color Modes and DC Balance

Figure 30:
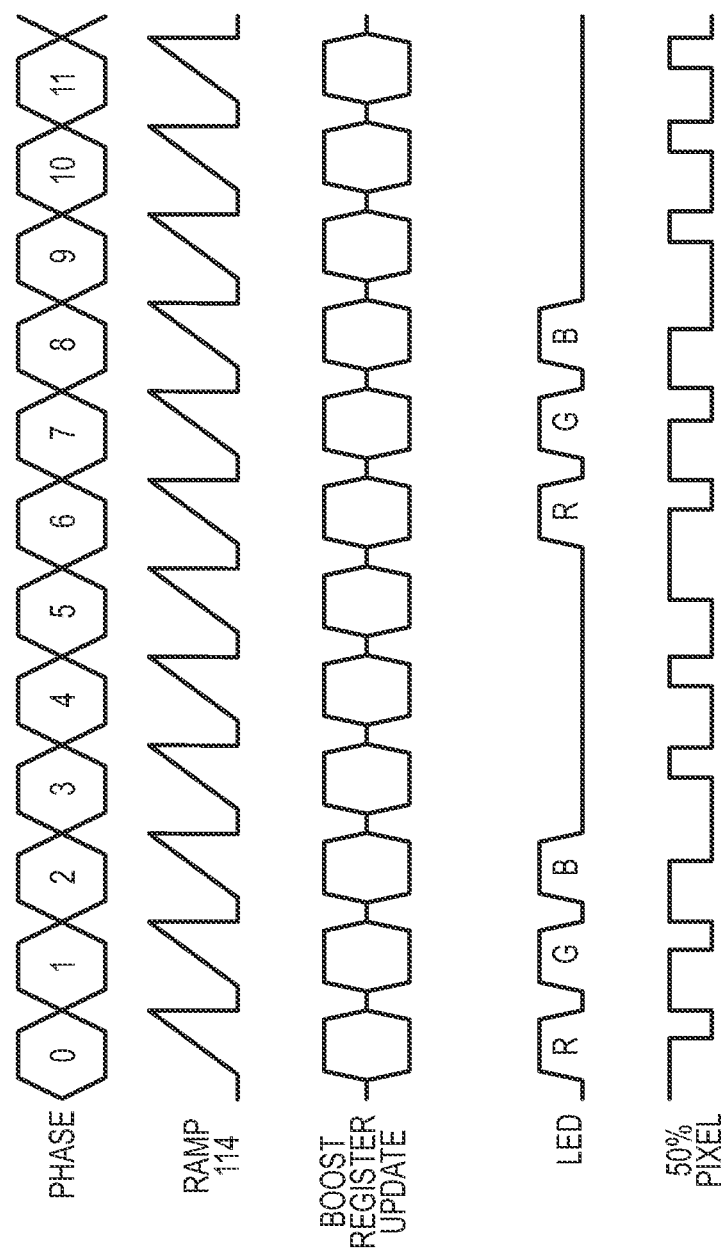
FIG. 30 is a timing diagram showing the various phases of sequential color operation of the present invention.

To provide flexibility in the sequential color display, and to provide for DC balance of the liquid crystal drive signal, as is known in the art to be desirable, the microdisplay of the present invention divides the frame time associated with each frame of video input data into a number of phases, for example twelve phases as shown in FIG. 30. During each phase, the variables listed in the following table can be independently controlled:

| VAR. # | VARIABLE | VALUES |
| --- | --- | --- |
| 0 | Illum | 0 = LED off; 1 = LED on |
| 1, 2 | PhaseColor | 00 = Red, 01 = Green, 10 = Blue |
| 3 | PixelOn | 0 = pixel switches to 0, 1 = pixel switches to 1 |
| 4 | FillDir | 0 = Fill outside to in, 1 = Fill inside to out |
| 5 | BlankWr | 0 = Disable pixel write during blanking; 1 = enable pixel write during blanking |
| 6 | BlankWrDir | 0 = Write pixel to 0 during blanking; 1 = Write pixel to 1 during blanking (if BlankWr is enabled) |

In the example of FIG. 30, the variables are programmed to take on the values show in the table below, for example by storing the tabulated sequence in appropriate registers in the display's EEPROM 126.

|       | VARIABLE |   |   |   |   |   |   |
|-------|---|---|---|---|---|---|---|
| PHASE | 0 | 1 | 2 | 3 | 4 | 5 | 6 |
| 0  | 1 | 0 | 0 | 0 | 0 | 0 | x |
| 1  | 1 | 0 | 1 | 0 | 0 | 1 | 1 |
| 2  | 1 | 1 | 0 | 0 | 0 | 1 | 1 |
| 3  | 0 | 0 | 0 | 1 | 0 | 0 | x |
| 4  | 0 | 0 | 1 | 1 | 0 | 1 | 0 |
| 5  | 0 | 1 | 0 | 1 | 0 | 1 | 0 |
| 6  | 1 | 0 | 0 | 0 | 0 | 0 | x |
| 7  | 1 | 0 | 1 | 0 | 0 | 1 | 1 |
| 8  | 1 | 1 | 0 | 0 | 0 | 1 | 1 |
| 9  | 0 | 0 | 0 | 1 | 0 | 0 | x |
| 10 | 0 | 0 | 1 | 1 | 0 | 1 | 0 |
| 11 | 0 | 1 | 0 | 1 | 0 | 1 | 0 |

The figure shows the ramp signal 114, the interval during which pixel boost registers are being updated, the periods during which the pixel array is illuminated by red, green, or blue light emitted by the LEDs, and the voltage of an exemplary pixel electrode, which pixel has been commanded to display a 50% neutral gray value. For 60 Hz input video, each phase has a duration of 1.389 ms.

During phase 0, the CDP comparators act on the red portion of decoded image data. For a period at the beginning of the phase, called the blanking period, all the pixels in the array are driven ON. The blanking period might typically have a duration of 400 µs. At the conclusion of the blanking period the ramp and comparison of decoded image data begins. At a time shortly after the beginning of the ramp, the red LED is turned on. Halfway through the ramp, for this exemplary pixel displaying 50% brightness, the comparator detects equality of the pixel image value and the ramp value, and the CDP commands the pixel to shut OFF. At the conclusion of the ramp, the LED is turned off, and all the pixels are again driven ON again in preparation for the beginning of the next phase. Phase 1 proceeds as did Phase 0, except this time it is the green LED that is activated while the green portion of the decoded image data is applied to the inputs of the comparators. Phase 2 follows Phase 1, with the blue LED and blue data. At the conclusion of Phase 1, no blanking signal is needed, since Phase 1 will be followed in this example by a DC-balancing phase (Phase 3, described next) which acts in an "inverse" way. For this reason, the final state of all the pixels and the end of Phase 2 is already what's needed to begin Phase 3 without any further explicit action. During Phase 3, the display again applies the red portion of decoded image data to the comparator inputs, but during this DC-balance phase the LEDs are kept off, and the pixel starts with its electrode low, putting the pixel in an OFF state, and it switches ON halfway through (i.e. the sense of action of the comparators is reversed). Additional DC-balance phases for the green and blue data follow during Phases 4 and 5. At Phase 6, the red, green blue display cycle starts again. In this way, each color is displayed twice during the frame, for a duration per color of 1.389 ms. Further, regardless of the image data value for a given pixel, its drive electrode spend half the frame time high, and half the frame time low, providing a DC-balanced drive signal to eliminate image sticking as is taught in U.S. Pat. No. 6,525,709, the contents of which are incorporated herein by reference. Denoting by R the period during which red data is displayed, and by r (the lower case version of the particular color) the corresponding DC-balance period, and so on, the display of the present invention can be programmed to display data in the order RGBrgbRGBrgb as illustrated in FIG. 30, or in the order RrGgBbRrGgBb, or, for further example, as gbrRBGgbrRBG, or in many other permutation.

Gamma Variation

As described previously, simple PWM schemes with constant illumination and ramp clock frequencies produce a display characteristic of $\gamma=1$, while $\gamma=2$ produces perceptually superior utilization of a limited gray bit depth. The display of the present invention can provide the desired gamma characteristic in a number of ways. In a first way, the LED intensity is ramped in concert with the ramp signal 114. This produces a quadratic variation of displayed intensity on image data value. The LED intensity is preferable controlled by a PWM scheme, to avoid variation of spectrum with instantaneous current value.

In a second way, the LED intensity is held constant during the ramp, but the frequency of the clock driving the ramp counter is "chirped" so that the interval between ramp values is relatively short for the portion of the ramp corresponding to dark pixel values, and relatively long for the portion of the ramp corresponding to bright pixel values. In either the LED-ramping or clock-chirping methods, a variety of gamma characteristics can be obtained by appropriate choice of how the LED brightness or clock frequency is varied with ramp count.

White-Point Adjustment

The ability to vary the LED intensity has another important advantage. RGB LED triads as provided have substantial variation in the relative brightnesses of the different colors, resulting in variation of the perceived white color. This can be corrected at the time of manufacture by measuring the relative intensities of the different LEDs under reference drive conditions, and providing the results of these measurements as efficiency coefficients that can be stored in the particular display's EEPROM. Then during operation, under the action of control block 116, the relative drive strengths provided to the different LEDs can be adjusted to exactly compensate for their variation, resulting in a consistent desired white point.

Temperature Compensation

It is desired to have microdisplays that display high-quality images over a wide range of operating temperatures, even though the characteristics of, for example, ferroelectric liquid crystal (FLC) modulators that might be employed change dramatically over the desired temperature range. For example, the switching speed of an FLC typically slows as the FLC temperature is reduced. This slow switching can cause degradation of display contrast ratio. The microdisplay of the present invention provides schemes for compensating these and similar effects.

LED Timing

Figure 31:
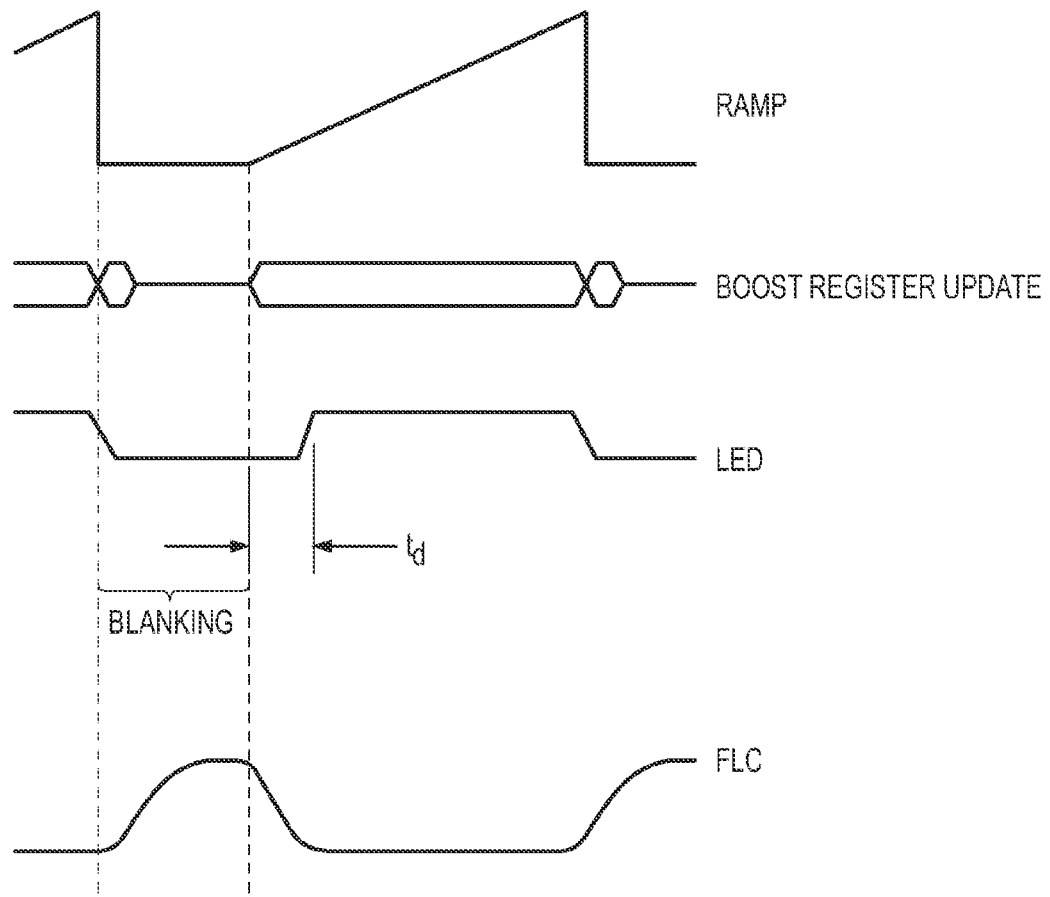
FIG. 31 is a timing diagram illustrating the temperature variation of the timing of the LED illumination according to the present invention.

A first compensation method involves temperature variation of the timing of the LED illumination, as is illustrated in FIG. 31. This figure shows a portion of one display phase for the same exemplary choice of variables chosen for FIG. 30. As can be seen, the ramp starts after the blanking period, but the onset of LED illumination is delayed by a time $t_D$. The display of the present invention provides for variation of the delay duration according to temperature sensed by temperature sensor 280, through the action of control block 116. For example, if the LED delay were kept constant, as the display temperature was reduced, the falling edge of the pixel FLC optical response would occur at later and later time, even when the pixel image value was zero, as shown in the figure. This would cause an undesirable amount of light to be reflected by the pixel, degrading achievable contrast ratio. This delay in FLC response can be compensated, according to the present invention, by increasing the delay in LED illumination relative to the start of the ramp. Values for desired LED delay times at various expected temperatures can be stored in EEPROM 126, further allowing the display of the present invention to programmably compensate for the characteristics of different FLC materials that might be used with it.

Pixel Drive Voltage

Figure 32:
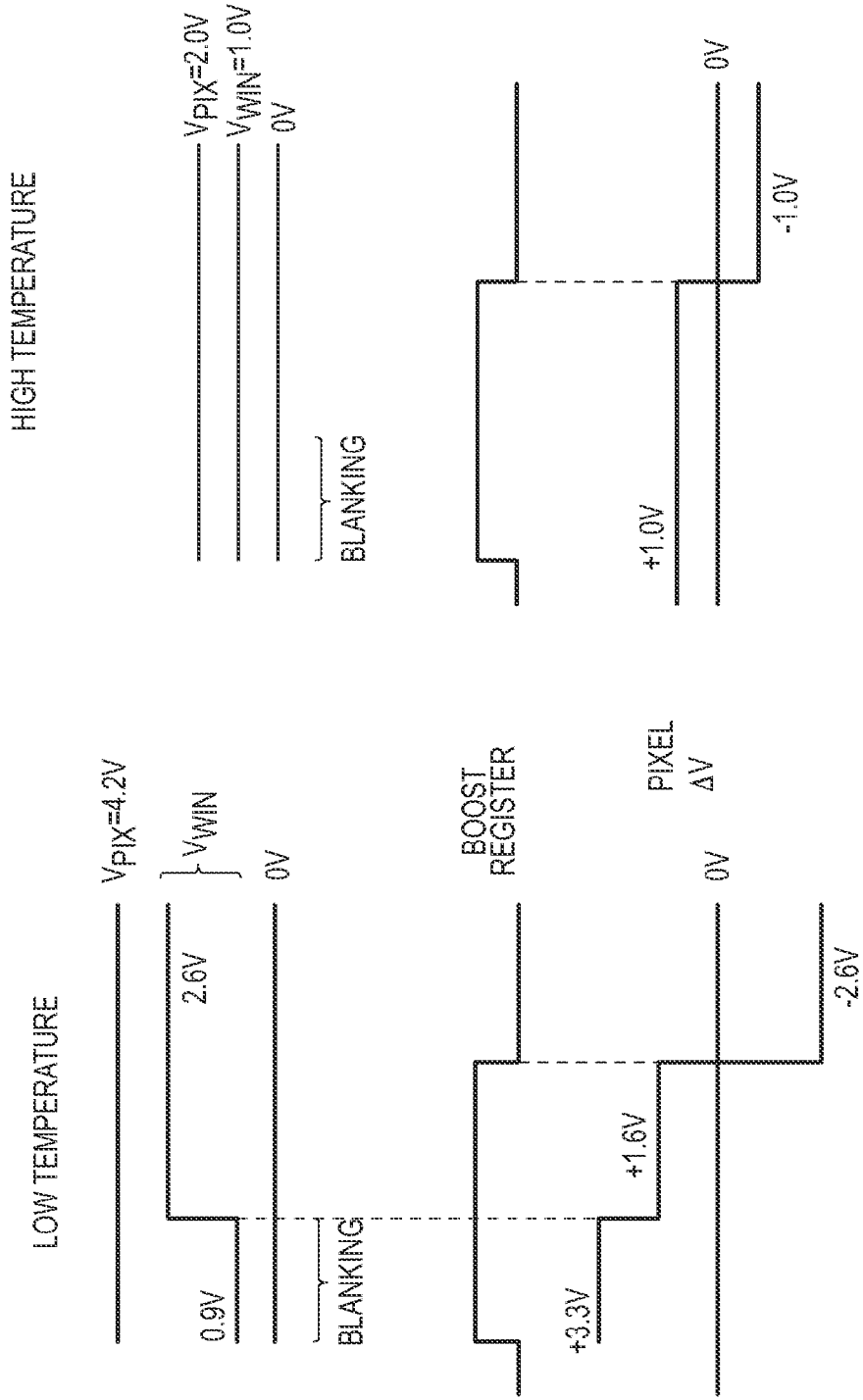
FIG. 32 is a timing diagram illustrating the varying of display characteristics for low-temperature and high-temperature operation according to the present invention.

Another way to compensate for varying display characteristics is described with reference to FIG. 32, which shows examples of the waveform of voltage ΔV across the pixel during a portion of a phase for typical low-temperature and high-temperature operation. At low temperature the FLC switches relatively slowly, and higher drive voltages are desired to increase its speed. Conversely, at high temperature it switches relatively fast, and lower drive voltages are optimum. As described previously with respect to the boost cell, the voltage $V_{PIX}$ can be varied through a range from lower than to higher than $V_{DD}$. As shown in the figure, $V_{PIX}$=4.2 V might be chosen for low temperature operation. Similarly, the voltage $V_{WIN}$ applied to the common electrode on the glass window can be varied, and stepped through different values within a phase. FIG. 32 shows the voltage $V_{WIN}$ set to 0.9 V during blanking, and the set to 2.6 V. The pixel electrode is driven to 0 V or to $V_{WIN}$ according to the state of the boost cell register. The resulting voltage ΔV across the liquid crystal is shown to have a high value of +3.3 V during blanking to ensure that the desired initial state is obtained quickly. Then, during the part of the phase during which the gray scale modulation is occurring, the pixel ΔV is dropped to +1.6 V to hold the already-obtained ON state. When the comparator detects equality for the illustrated pixel and changes the state of its boost register, the pixel electrode voltage falls to 0 V, resulting in a relatively high ΔV=−2.6 V applied across the modulator. In contrast, at high temperature, $V_{PIX}$ might be set to a lower 2.0 V, and $V_{WIN}$ might be set 1.0 V, and held constant. In this case the ΔV across the pixel starts out at +1.0 V during blanking, and remains at that level until its boost-cell register is changed, at which point it changes to −1.0 V.

Low-Power Operation

There are at least two other modes that provide for further power savings. First of all, it is possible that power could be kept applied to the microdisplay yet it would not receive any new image data sent to it nor would it continue to display any images. At some subsequent time, a command could be given to resume displaying images and the image stored in the SRAM memory cells that constitute the frame buffer could be displayed even without new image data being sent to the microdisplay. It can be appreciated that this would possibly result in power savings in the device that the microdisplay was located in or power savings in a device that had previously been transmitting image data to that device in the case of the microdisplay being located at the receiving end of a communication link. It would also result in some power savings by the microdisplay itself as there would be no clock or data reads or writes while no image was being displayed. A second power-saving mode might include the display continuing to display data without receiving new image data. This could occur in a digital still camera application, for example, where there might be no need for the camera to continue to send the same image data to the microdisplay while a previously-captured image was being displayed for review by the operator. The power savings in this mode would be primarily in the camera, but the microdisplay would also have some power savings here since no new data would need to have gamma correction, scaling, encoding, and writing to the frame buffer.

Summary of Advantages

The microdisplay circuitry and gray-scale scheme described above have substantial advantages over the prior art. Pulse-width modulation drive, with a limited number of pixel-drive transitions per image field, is implemented fully digitally. "DEF" image compression reduces the number of bits needed to be stored per pixel, without requiring the complexities of circuitry required for more sophisticated compression algorithms such as JPEG, or even canonical 4:1:1 YUV. Furthermore, the digital comparator needed to implement PWM is shared between many pixels rather than being implemented in each pixel. In these ways, the complexity of the display is minimized. According to the present invention, as the number of pixels in the display is increased, the number of transistors needed to be added per pixel (but not to the pixel) is equal to 144, i.e. 24 six-transistor SRAM registers per pixel comprising a double-buffered image storage of twelve bits per frame plus 14 transistors for the pixel boost cell, for a total of 158. Alternative variants of the DEF scheme reduce the number of bits required per pixel from 12 to as low as 10, further reducing the per-pixel complexity to 120+14=134 transistors. As described above in the background of the invention, straightforward implementation of a digital PWM architecture without image compression results in a display complexity of 772 transistors per pixel if 24-bit color is desired. Thus, microdisplays according to the present invention have substantially reduced complexity compared to other all-digital PWM implementations. Specifically, the present invention includes an improved design that requires only a marginal additional transistor count of less than 700, less than 600, less than 500, less than 400, less than 300, less than 200, less than 160, less than 150, less than 140, and less than 135. The simpler pixels of the present invention translate directly into smaller achievable pixels sizes, and accordingly reduced die sizes, higher silicon yields, and reduced backplane fabrication costs. Compared to the straightforward 24-bit digital PWM implementation, the microdisplay of the present invention has approximately five times fewer transistors associated with each pixel, resulting in 2.25-times finer achievable pixel pitch.

These advantages may be illustrated by comparative examples. The applicant implemented a microdisplay according the present invention as a 432×240 array of pixels in a 0.25 μm CMOS process. In this exemplary implementation, the pixels had a width of 12.0 μm, and a height of 16.2 μm, giving active area 82 a width of 5.184 mm and a height of 3.888 mm. In this exemplary implementation the height of active area 82 plus the additional SRAM areas 88 and 90 was 5.896 mm, which included a few spare rows of SRAM registers to provide redundancy. Each SRAM register in this implementation occupied a 2.74 μm×3.60 μm cell. Thus, the area associated with a pixel was (5184 μm×5896 μm)/(432×240)=295 μm²/pixel. This can be compared to the area per pixel in a microdisplay according to the prior art described above, which pixel requires 772 transistors. If this pixel were implemented in the same 0.25 μm CMOS process, and were implemented as densely as typical SRAM, which according to estimates provided above would require a cell of area 130 (0.25 μm)² for every six transistors, then each pixel would require an area of 1045 μm², not counting additional transistors that would be needed to provide pixel boost cells in this low voltage (2.5 V) CMOS process.

In this exemplary implementation, the CDP of the present microdisplay required 8846 transistors per slice, which amounts to about 2950 transistors per column, once accounting is made for the fact that a slice is either the upper half or lower half of a six-pixel-column-wide piece of the display. Thus, adding the CDP adds approximately 2950/240≈12 transistors per pixel. In applicant's exemplary implementation each CDP had a height of about 350 μm. If the 700 μm height of both CDPs is added to the 5.896 mm array height, to yield a total height of 6.6 mm, the total array area per pixel is increased to 330 μm², still a very considerable area savings over the 1045 μm² area needed for the prior art type of double-buffered digital gray-scale display.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed is:

1. A liquid crystal display device, comprising:
    an array of active pixels, the active pixels electrically switchable between a first pixel voltage and a second pixel voltage;
    a common electrode driven by a common window voltage; and
    a layer of liquid crystal material between the array of active pixels and the common electrode;
    wherein the array of active pixels begin a light-modulating period while coupled to receive the first pixel voltage and is coupled to receive the second pixel voltage after determined time periods that are proportional to gray scale values of input image data corresponding to the pixels, and wherein the common window voltage is adjusted such that during the light modulating period a holding voltage field between the first pixel voltage and the common window voltage is of relatively lower magnitude than a pixel switching voltage field between the common window voltage and the second pixel voltage.

2. The liquid crystal display device of claim 1, wherein a component color of an input image is displayed during a the display phase, the display phase including a blanking period and the light modulating period, and wherein the common window voltage is temporally adjusted to a blanking window voltage during the blanking period and a light modulating window voltage during the light modulating period.

3. A liquid crystal display device, comprising:
    an array of active pixels, the array of active pixels switchable between a first pixel voltage and a second pixel voltage;
    a common electrode driven by a common window voltage; and
    a layer of liquid crystal material between the array of pixel electrodes and the common electrode;
    wherein the common window voltage is temporally adjusted within a display phase corresponding to a component color of an image, the display phase including a blanking time period during which all pixels of the array of active pixels are set to the first pixel voltage and a light modulating time period during which pixels of the array of active pixels switch to the second pixel voltage after determined time periods that are proportional to gray scale values of input image data corresponding to the pixels.

4. The liquid crystal display device of claim 3, wherein the common window voltage is driven to a first window voltage during the blanking period and a second window voltage during the gray scale modulating period.

5. The liquid crystal display device of claim 4, wherein the first pixel voltage is a relatively higher voltage than the second pixel voltage, and wherein the first window voltage is a relatively lower voltage than the second window voltage.

6. The liquid crystal display device of claim 4, wherein the first and second window voltages are adjusted based on one or more environmental conditions.

7. The liquid crystal display device of claim 6, wherein one of the one or more environmental conditions is temperature.

8. The liquid crystal display device of claim 7, wherein a blanking voltage field between the first pixel voltage and the first window voltage is relatively higher at a relatively lower temperature and relatively lower at a relatively higher temperature.

9. The liquid crystal display device of claim 6, wherein at least one of the first and second pixel voltages is also adjusted based on the one or more environmental conditions.

10. The liquid crystal display device of claim 9, wherein a voltage field between the first pixel voltage and the first window voltage is relatively higher at a relatively lower temperature and relatively lower at a relatively higher temperature.

11. The liquid crystal display device of claim 9, wherein a voltage field between the common window voltage and the second pixel voltage is relatively higher at a relatively lower temperature and relatively lower at a relatively higher temperature.

* * * * *